United States Patent
Wang et al.

(10) Patent No.: US 12,419,109 B2
(45) Date of Patent: Sep. 16, 2025

(54) ARRAY SUBSTRATE AND MANUFACTURING METHOD THEREOF, AND DISPLAY PANEL

(71) Applicant: BOE Technology Group Co., Ltd., Beijing (CN)

(72) Inventors: Lizhong Wang, Beijing (CN); Guangcai Yuan, Beijing (CN); Ce Ning, Beijing (CN); Dongfang Wang, Beijing (CN); Liping Lei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/278,413

(22) PCT Filed: Sep. 26, 2022

(86) PCT No.: PCT/CN2022/121475
§ 371 (c)(1),
(2) Date: Aug. 23, 2023

(87) PCT Pub. No.: WO2024/065111
PCT Pub. Date: Apr. 4, 2024

(65) Prior Publication Data
US 2025/0015092 A1   Jan. 9, 2025

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136209* (2013.01); *G02F 1/136286* (2013.01);
(Continued)

(58) Field of Classification Search
CPC .................................................. G02F 1/1362
See application file for complete search history.

(56) References Cited

U.S. PATENT DOCUMENTS

2019/0348449 A1* 11/2019 Gui ................... H01L 27/1237
2020/0286926 A1*  9/2020 Niu ................... H01L 29/66969
(Continued)

FOREIGN PATENT DOCUMENTS

| CN | 107479766 A | 12/2017 |
|----|-------------|---------|
| CN | 109273404 A | 1/2019 |

(Continued)

*Primary Examiner* — Richard H Kim
(74) *Attorney, Agent, or Firm* — XSENSUS LLP

(57) ABSTRACT

Provided is an array substrate. The array substrate includes a display region and a non-display region located at a periphery of the display region, wherein the array substrate includes a substrate; a first transistor and a second transistor that are disposed on the substrate, wherein the first transistor is disposed in the display region, and the second transistor is disposed in the non-display region; and a data line and a pixel electrode that are disposed in the display region, wherein the data line is disposed on a side of the first active layer close to the substrate and is lapped with the first active layer, and the pixel electrode is disposed on a side of the first gate facing away from the substrate and is lapped with the first active layer.

20 Claims, 9 Drawing Sheets

(51) Int. Cl.
*G02F 1/1368* (2006.01)
*H10D 86/40* (2025.01)

(52) U.S. Cl.
CPC ......... *G02F 1/1368* (2013.01); *H10D 86/441* (2025.01); *H10D 86/421* (2025.01)

(56) References Cited

U.S. PATENT DOCUMENTS

| | | | |
|---|---|---|---|
| 2020/0287052 A1* | 9/2020 | Qu | H10K 50/84 |
| 2021/0118968 A1 | 4/2021 | Lee et al. | |
| 2021/0181554 A1* | 6/2021 | Hong | G02F 1/13439 |
| 2022/0320219 A1* | 10/2022 | Zheng | H10K 71/00 |
| 2023/0099934 A1 | 3/2023 | Gong et al. | |
| 2023/0317740 A1 | 10/2023 | Wang et al. | |
| 2024/0047466 A1 | 2/2024 | Tan et al. | |
| 2024/0272497 A1* | 8/2024 | Tong | G02F 1/136227 |

FOREIGN PATENT DOCUMENTS

| | | |
|---|---|---|
| CN | 109817645 A | 5/2019 |
| CN | 110690170 A | 1/2020 |
| CN | 110993613 A | 4/2020 |
| CN | 111341814 A | 6/2020 |
| CN | 112151692 A | 12/2020 |
| CN | 112713157 A | 4/2021 |
| CN | 112992920 A | 6/2021 |
| CN | 113270424 A | 8/2021 |
| CN | 113314547 A | 8/2021 |
| CN | 111725324 B | 11/2021 |
| CN | 113745246 A | 12/2021 |
| CN | 114068590 A | 2/2022 |
| CN | 215896391 U | 2/2022 |
| CN | 114122007 A | 3/2022 |
| CN | 114203732 A | 3/2022 |
| CN | 114730776 A | 7/2022 |
| CN | 115064115 A | 9/2022 |

* cited by examiner

ARRAY SUBSTRATE AND MANUFACTURING METHOD THEREOF, AND DISPLAY PANEL

CROSS-REFERENCE TO RELATED APPLICATIONS

This application is a U.S. national stage of international application No. PCT/CN2022/121475, filed on Sep. 26, 2022, the disclosure of which is incorporated herein by reference in its entirety.

TECHNICAL FIELD

The present disclosure relates to the field of display technologies, and in particular relates to an array substrate and a manufacturing method thereof, and a display panel.

BACKGROUND

Liquid crystal display panels have the characteristics of small size, low power consumption, no radiation and the like, and dominate the current display market.

SUMMARY

Embodiments of the present disclosure provide an array substrate and a manufacturing method thereof, and a display panel. The technical solutions are as follows.

In some embodiments of the present disclosure, an array substrate is provided. The array substrate includes a display region and a non-display region located at a periphery of the display region. The array substrate includes:
- a substrate;
- a first transistor and a second transistor that are disposed on the substrate, wherein the first transistor is disposed in the display region, and the second transistor is disposed in the non-display region; the first transistor includes a first gate and a first active layer, the first gate being disposed on a side of the first active layer facing away from the substrate; and the second transistor includes a second active layer and a second gate; and
- a data line and a pixel electrode that are disposed in the display region, wherein the data line is disposed on a side of the first active layer close to the substrate and is lapped with the first active layer, and the pixel electrode is disposed on a side of the first gate facing away from the substrate and is lapped with the first active layer;
- wherein the data line and the second gate are disposed in a same layer and made of a same material.

In some embodiments, the first active layer includes a first conductor portion and a second conductor portion opposite to each other, and a first channel region disposed between the first conductor portion and the second conductor portion, an orthographic projection of the first channel region on the substrate is within an orthographic projection of the first gate on the substrate; wherein an orthographic projection of the data line on the substrate has an overlapping region with an orthographic projection of the first conductor portion on the substrate, and the first conductor portion is lapped with the data line; and an orthographic projection of the pixel electrode on the substrate has an overlapping region with an orthographic projection of the second conductor portion on the substrate, and the pixel electrode is lapped with the second conductor portion.

In some embodiments, the array substrate further includes: a transparent connecting electrode disposed between the pixel electrode and the first active layer, wherein an orthographic projection of the transparent connecting electrode on the substrate has an overlapping region with the orthographic projection of the pixel electrode on the substrate, and has an overlapping region with the orthographic projection of the second conductor portion on the substrate, and the pixel electrode is lapped with the second conductor portion by means of the transparent connecting electrode.

In some embodiments, the array substrate further includes: a light shielding layer, wherein the light shielding layer and the data line are disposed in a same layer and made of a same material, and the orthographic projection of the first channel region on the substrate is within an orthographic projection of the light shielding layer on the substrate.

In some embodiments, a plurality of first transistors are provided, and the light shielding layer includes a plurality of light shielding blocks in one-to-one correspondence with the plurality of first transistors, wherein the orthographic projection of the first channel region of the first active layer in the first transistor on the substrate is within an orthographic projection of the corresponding light shielding block on the substrate.

In some embodiments, the first active layer and the second active layer are disposed in different layers, and the second active layer is closer to the substrate than the second gate is.

In some embodiments, the second transistor further includes: a source and a drain which are lapped with the second active layer, wherein the source and the drain are disposed in a same layer and made of a same material, and the source and the drain are both disposed on a side of the second gate facing away from the substrate; wherein the source, the drain and the first active layer are disposed in the same layer, and a material of the first active layer is different from a material of the source and the drain; or the source, the drain and the first gate are disposed in the same layer and made of the same material.

In some embodiments, in a case that the source, the drain and the first active layer are disposed in the same layer, the array substrate further includes: a first gate insulating layer disposed between the second gate and the second active layer, and an auxiliary insulating layer disposed between the first active layer and the data line;

the array substrate is provided with a first via hole penetrating through the auxiliary insulating layer, and a plurality of lap joint via holes penetrating through the auxiliary insulating layer and the first gate insulating layer, wherein the first active layer is lapped with the data line through the first via hole, the source is lapped with the second active layer through one of the lap joint via holes, and the drain is lapped with the second active layer through another one of the lap joint via holes;

wherein an opening of the first via hole facing away from the substrate and openings of the lap joint via holes facing away from the substrate are all on a surface of the auxiliary insulating layer facing away from the substrate.

In some embodiments, the array substrate further includes: a second gate insulating layer and an interlayer dielectric layer; wherein the second active layer is disposed on a side of the first gate insulating layer close to the substrate; the data line and the second gate are both disposed between the first gate insulating layer and the auxiliary insulating layer; the first active layer, the source and the drain are all disposed between the auxiliary insulating layer and the second gate insulating layer; and the first gate is disposed between the second gate insulating layer and the interlayer dielectric layer.

In some embodiments, the first active layer and the second active layer are disposed in a same layer but made of different materials, and the second gate is closer to the substrate than the second active layer is.

In some embodiments, the second transistor further includes: a source and a drain which are lapped with the second active layer, wherein the source and the drain are disposed in a same layer and made of a same material, and the source and the drain are both disposed on a side of the second active layer facing away from the substrate;

wherein the array substrate further includes: a connecting electrode, wherein the connecting electrode is lapped with the first active layer and the data line, and the connecting electrode, the first gate, the source and the drain are disposed in a same layer and made of a same material.

In some embodiments, the array substrate further includes: a first gate insulating layer disposed between the second gate and the second active layer, and a second gate insulating layer disposed between the first active layer and the first gate;

wherein the array substrate is provided with a first sub-via hole penetrating through the second gate insulating layer and the first gate insulating layer, and a second sub-via hole and a plurality of lap joint via holes penetrating through the second gate insulating layer, wherein the connecting electrode is lapped with the first active layer through the second sub-via hole, and is lapped with the data line through the first sub-via hole, the source is lapped with the second active layer through one of the lap joint via holes, and the drain is lapped with the second active layer through another one of the lap joint via holes;

wherein an opening of the first sub-via hole facing away from the substrate, an opening of the second sub-via hole facing away from the substrate, and openings of the lap joint via holes facing away from the substrate are all on a surface of the second gate insulating layer facing away from the substrate.

In some embodiments, the array substrate further includes: an interlayer dielectric layer; wherein the second gate and the data line are disposed on a side of the first gate insulating layer close to the substrate; the first active layer and the second active layer are disposed between the first gate insulating layer and the second gate insulating layer; and the source, the drain, the connecting electrode and the first gate are all disposed between the second gate insulating layer and the interlayer dielectric layer.

In some embodiments, the array substrate further includes: a transparent connecting electrode disposed on a side of the interlayer dielectric layer facing away from the substrate, and a planarization layer disposed on a side of the transparent connecting electrode facing away from the substrate, the pixel electrode being disposed on a side of the planarization layer facing away from the substrate;

wherein the array substrate is provided with a connecting via hole penetrating through the planarization layer, and a second via hole penetrating through the interlayer dielectric layer and the second gate insulating layer, the pixel electrode is lapped with the transparent connecting electrode through the connecting via hole, and the transparent connecting electrode is lapped with the first active layer through the second via hole.

In some embodiments, the array substrate further includes: a passivation layer disposed on a side of the pixel electrode facing away from the substrate, and a common electrode layer disposed on a side of the passivation layer facing away from the substrate.

In some embodiments, the common electrode layer includes: a light shielding portion and a transparent conductive portion disposed on a side of the light shielding portion facing away from the substrate, wherein an orthographic projection of the light shielding portion on the substrate is not overlapped with an orthographic projection of the pixel electrode on the substrate.

In some embodiments, the array substrate further includes: a support part, wherein a portion of the support part is in the connecting via hole, and the other portion is outside the connecting via hole.

In some embodiments, the first transistor is an oxide thin film transistor, and the second transistor is a low temperature poly-silicon thin film transistor.

In some embodiments, the array substrate further includes: a gate drive circuit disposed in the non-display region, wherein the gate drive circuit includes a plurality of second transistors.

In some embodiments of the present disclosure, a method of manufacturing an array substrate is provided. The array substrate includes a display region and a non-display region located at a periphery of the display region. The method includes:

forming a first transistor, a second transistor, a data line and a pixel electrode on a substrate;

wherein the first transistor is disposed in the display region, and the second transistor is disposed in the non-display region; the first transistor includes a first gate and a first active layer, the first gate being disposed on a side of the first active layer facing away from the substrate; and the second transistor includes a second active layer and a second gate;

the data line and the pixel electrode are both disposed in the display region, the data line is disposed on a side of the first active layer close to the substrate, the data line is lapped with the first active layer, the pixel electrode is disposed on a side of the first gate facing away from the substrate, and the pixel electrode is lapped with the first active layer;

wherein the data line and the second gate are disposed in a same layer and made of a same material.

In some embodiments of the present disclosure, a display panel is provided. The display panel includes: an array substrate and a color filter substrate disposed opposite to each other, and a liquid crystal layer disposed between the array substrate and the color filter substrate, wherein the array substrate is the array substrate as described above.

BRIEF DESCRIPTION OF DRAWINGS

To describe the technical solutions in the embodiments of the present disclosure more clearly, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort.

DETAILED DESCRIPTION

To make the objects, technical solutions, and advantages of the present disclosure clearer, the embodiments of the present disclosure are further described in detail hereinafter with reference to the accompanying drawings.

Generally, a liquid crystal display panel includes an array substrate and a color filter substrate disposed opposite to each other, and a liquid crystal layer disposed therebetween. The array substrate may be integrated with a plurality of thin film transistors (TFTs) in the display region, and a plurality of data lines electrically connected to the plurality of TFTs in one-to-one correspondence, and the array substrate may be integrated with a gate driver on array (GOA) circuit in the non-display region. The GOA circuit may be electrically connected to the gate of the TFT through a gate line, so that the GOA circuit can control the TFT to be turned on and off. When the TFT is turned on, the data line electrically connected to the TFT can apply pixel voltage to a pixel electrode electrically connected to the TFT.

However, the parasitic capacitance between the pixel electrode and the data line in the current array substrate is large, resulting in a high overall power consumption of the array substrate.

Figure 1:
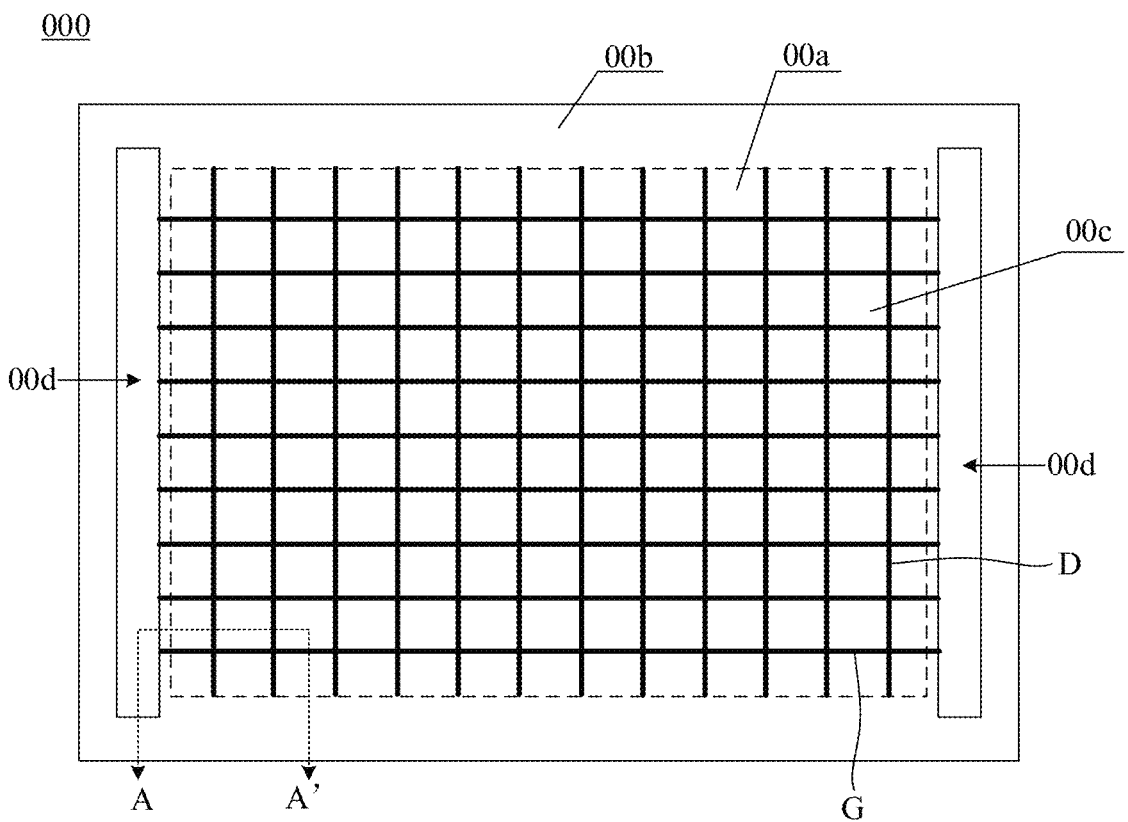
FIG. 1 is a top view of an array substrate according to some embodiments of the present disclosure.
Figure 2:
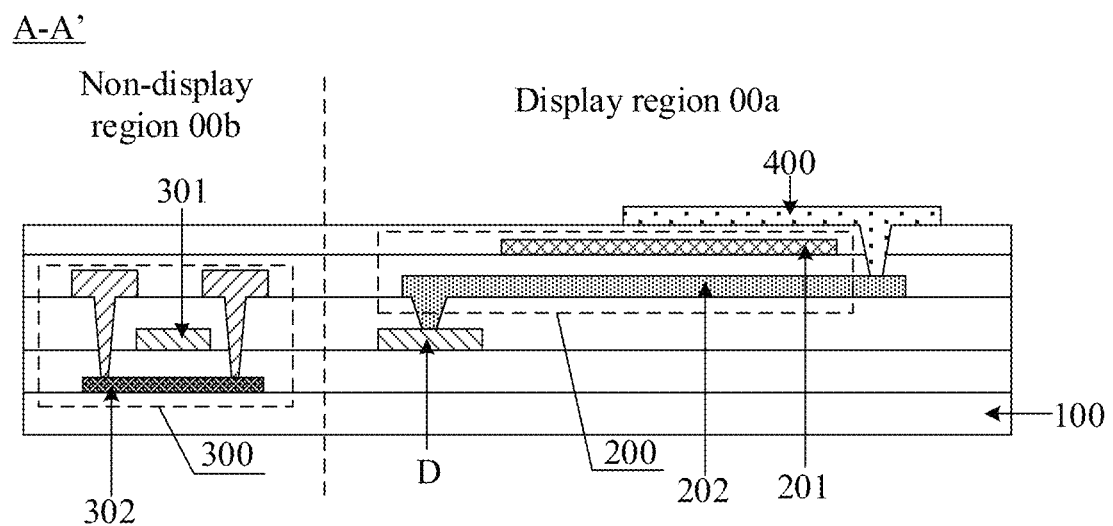
FIG. 2 is a schematic structural diagram of film layers in the array substrate shown in FIG. 1 along a line A-A'.

Referring to FIG. 1 and FIG. 2, FIG. 1 is a top view of an array substrate according to some embodiments of the present disclosure, and FIG. 2 is a schematic structural diagram of film layers in the array substrate shown in FIG. 1 along a line A-A'. The array substrate 000 includes a display region 00a and a non-display region 00b located at the periphery of the display region 00a. Here, the array substrate 000 includes a substrate 100, and a first transistor 200 and a second transistor 300 that are disposed on the substrate 100.

The first transistor 200 in the array substrate 000 is disposed in the display region 00a, and the first transistor 200 includes a first gate 201 and a first active layer 202. The first gate 201 of the first transistor 200 is disposed on a side of the first active layer 202 facing away from the substrate 100.

The second transistor 300 in the array substrate 000 is disposed in the non-display region 00b, and the second transistor 300 includes a second gate 301 and a second active layer 302.

In the present disclosure, the array substrate 000 further includes a data line D and a pixel electrode 400 that are disposed in the display region 00a. The data line D is disposed on a side, close to the substrate 100, of the first active layer 202 of the first transistor 200, and the first active layer 202 of the first transistor 200 is lapped with the data line D. The pixel electrode 400 is disposed on a side, facing away from the substrate 100, of the first gate 201 of the first transistor 200, and the first active layer 202 of the first transistor 200 is lapped with the pixel electrode 400. In this way, it is ensured that the first transistor 200 in the display region 00a is electrically connected to the data line D, and is electrically connected to the pixel electrode 400.

In the embodiments of the present disclosure, the array substrate 000 further includes a gate line G disposed in the display region 00a, and the gate line G is electrically connected to the gate 201 of the first transistor 200.

Exemplarily, a plurality of gate lines G and a plurality of data lines D are provided in the array substrate 000. The plurality of gate lines G are arranged in parallel, the plurality of data lines D are arranged in parallel, and an extending direction of the gate line G is perpendicular to an extending direction of the data line D. In this way, every two adjacent gate lines G and every two adjacent data lines D form a sub-pixel region 00c.

A plurality of first transistors 200 are provided in the array substrate 000, the plurality of first transistors 200 correspond to the plurality of sub-pixel regions 00c, and each of the plurality of sub-pixel regions 00c is provided with at least one corresponding first transistor 200. Correspondingly, a plurality of pixel electrodes 400 are provided in the array substrate 000, the plurality of pixel electrodes 400 correspond to the plurality of sub-pixel regions 00c, and each of the plurality of sub-pixel regions 00c is provided with a corresponding pixel electrode 400. Moreover, the pixel electrode 400 in each sub-pixel region 00c is electrically connected to the first active layer 202 of the first transistor 200 in the sub-pixel region 00c.

In this case, when a gate signal is loaded on the gate line G electrically connected to the first gate 201 of the first transistor 200 in a certain sub-pixel region 00c, the first transistor 200 is in a turned-on state, that is, the first active layer 202 of the first transistor 200 can transmit an electrical signal, so that the data line D electrically connected to the first active layer 202 can apply a data signal to the pixel electrode 400 electrically connected to the first active layer 202, and thus the pixel electrode 400 can load pixel voltage.

In the present disclosure, a plurality of second transistors 300 are provided in the array substrate 000, and the second transistors 300 are all transistors in a gate driver on array (GOA) circuit. Exemplarily, the array substrate 000 further includes a GOA circuit 00d disposed in the non-display region 00b. The GOA circuit 00d is electrically connected to the gate line G in the display region 00a. In this way, the GOA circuit 00d can apply a gate signal to the gate line G, so that the GOA circuit 00d can control the first transistor 200 to be turned on or turned off through the gate line G.

In some embodiments, the first transistor 200 in the present disclosure is an oxide TFT, that is, the first active layer 202 of the first transistor 200 is made of an oxide semiconductor material. The second transistor 300 in the present disclosure is a low temperature poly-silicon (LTPS) TFT, that is, the second active layer 302 of the second transistor 300 is made of an LTPS semiconductor material. In this case, the array substrate 000 in the present disclosure is a low temperature polycrystalline oxide (LTPO) substrate. This array substrate 000 has the advantages of high mobility of LTPS and low leakage current of oxide. Because the oxide semiconductor material has high light transmittance, when the first transistor 200 in the display region 00a is the oxide TFT, high light transmittance of the array substrate 000 can be ensured, thereby improving the display effect of the display panel integrated with the array substrate 000. In addition, because the LTPS semiconductor material has the characteristic of high mobility, when the second transistor 300 in the non-display region 00b is the LTPS TFT, it can be ensured that the second transistor 300 has a small size. Thus, the width of the non-display region 00b of the array substrate 000 is small, thereby realizing the narrow bezel design of the display panel integrated with the array substrate 000.

In the embodiments of the present disclosure, the data line D in the array substrate 000 is disposed on the side, close to the substrate 100, of the first active layer 202 of the first transistor 200, the first gate 201 of the first transistor 200 in the array substrate 000 is disposed on the side, facing away from the substrate 100, of the first active layer 202, and the pixel electrode 400 in the array substrate 000 is disposed on the side, facing away from the substrate 100, of the first gate 201 of the first transistor 200. Therefore, it can be ensured that in the direction perpendicular to the substrate 100, the vertical distance between the data line D and the pixel electrode 400 is relatively big, thereby ensuring that the parasitic capacitance generated between the data line D and the pixel electrode 400 is small. Thus, the probability that the parasitic capacitance interferes with the data signal loaded on the data line D is low, and the data signal loaded on the data line D can be normally transmitted to the pixel electrode 400, thereby effectively reducing the power consumption of the array substrate 000.

In the present disclosure, the data line D in the array substrate 000 and the second gate 301 of the second transistor 300 are disposed in the same layer and made of the same material. It should be noted that two structures being disposed in the same layer and made of the same material in the present disclosure means that the two structures are formed by one patterning process. For example, in the case that the data line D and the second gate 301 are disposed in the same layer and made of the same material, the data line D and the second gate 301 are formed by one patterning process. Here, one patterning process refers to thin film deposition, photoresist coating, exposure, development, etching and photoresist stripping. In this case, the manufacturing difficulty of the array substrate 000 can be effectively reduced on the premise of ensuring the small parasitic capacitance generated between the data line D and the pixel electrode 400.

In summary, the array substrate provided in the embodiments of the present disclosure includes a substrate, and a first transistor, a second transistor, a data line, and a pixel electrode that are disposed on the substrate. The data line in the array substrate is disposed on the side, close to the substrate, of the first active layer of the first transistor, the first gate of the first transistor in the array substrate is disposed on the side, facing away from the substrate, of the first active layer, and the pixel electrode in the array substrate is disposed on the side, facing away from the substrate, of the first gate of the first transistor. Therefore, it can be ensured that in the direction perpendicular to the substrate, the vertical distance between the data line and the pixel electrode is relatively big, thereby ensuring that the parasitic capacitance generated between the data line and the pixel electrode is small. Thus, the probability that the parasitic capacitor interferes with the data signal loaded on the data line is low, and the data signal loaded on the data line can be normally transmitted to the pixel electrode, thereby effectively reducing the power consumption of the array substrate. In addition, in the array substrate, the data line and the gate of the second transistor are disposed in the same layer and made of the same material, which can effectively reduce the manufacturing difficulty of the array substrate on the premise of ensuring the small parasitic capacitance generated between the data line and the pixel electrode.

Figure 3:
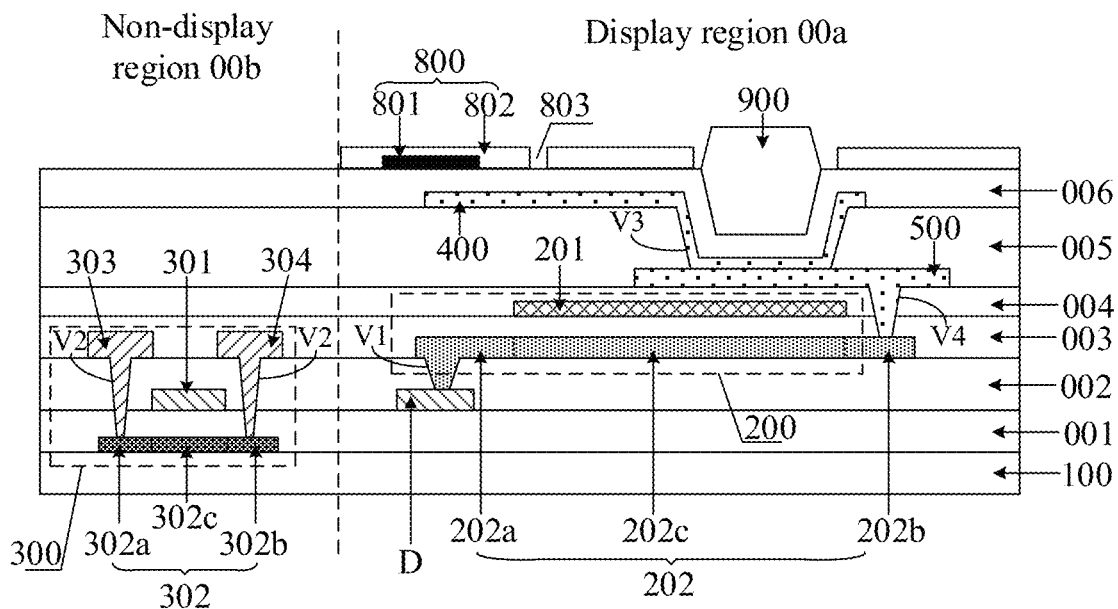
FIG. 3 is a schematic structural diagram of film layers in another array substrate according to some embodiments of the present disclosure.

In the embodiments of the present disclosure, as shown in FIG. 3, FIG. 3 is a schematic structural diagram of film layers in another array substrate according to some embodiments of the present disclosure. The first active layer 202 of the first transistor 200 in the array substrate 000 includes a first conductor portion 202a and a second conductor portion 202b disposed opposite to each other, and a first channel region 202c disposed between the first conductor portion 202a and the second conductor portion 202b. An orthographic projection of the first channel region 202c of the first active layer 202 on the substrate 100 is within an orthographic projection of the first gate 201 on the substrate 100.

The orthographic projection of the data line D in the array substrate 000 on the substrate 100 has an overlapping region with the orthographic projection of the first conductor portion 202a on the substrate 100, and the data line D is lapped with the first conductor portion 202a of the first active layer 202. The orthographic projection of the pixel electrode 400 in the array substrate 000 on the substrate 100 has an overlapping region with the orthographic projection of the second conductor portion 202b on the substrate 100, and the pixel electrode 400 is lapped with the second conductor portion 202b of the first active layer 202.

Therefore, when a gate drive signal is loaded on the first gate 201, carriers are generated in the first channel region 202c of the first active layer 202, and the first conductor portion 202a and the second conductor portion 202b of the first active layer 202 can be electrically connected to each other, so that the corresponding data line D can transmit the data signal to the corresponding pixel electrode 400. When loading the gate drive signal to the first gate 201 is stopped, carriers are no longer generated in the first channel region 202c of the first active layer 202, and the electrical connection between the first conductor portion 202a and the second conductor portion 202b of the first active layer 202 is cut off, so that the corresponding data line D stops transmitting the data signal to the corresponding pixel electrode 400.

In this case, when the data line D is electrically connected to the first conductor portion 202a of the first active layer 202 in a direct lap joint manner, and the pixel electrode 400 is electrically connected to the second conductor portion 202b of the first active layer 202 in a direct lap joint manner, the electrical connection between the data line D and the first active layer 202 and the electrical connection between the pixel electrode 400 and the first active layer 202 can be achieved, without providing the source and the drain in the first transistor 200. The first active layer 202 of the first transistor 200 is made of an oxide semiconductor material, which is a transparent semiconductor material, and the source and the drain of the TFT are generally made of an opaque metal material. Therefore, when the source and the drain are not provided in the first transistor 200, the shielding of the first active layer 202 by the source and the drain can be reduced, thereby effectively increasing the aperture ratio of the array substrate 000, and further improving the light transmittance of the array substrate 000.

In some embodiments, as shown in FIG. 3, the array substrate 000 further includes a transparent connecting electrode 500 disposed between the pixel electrode 400 and the first active layer 202 of the first transistor 200. For example, the transparent connecting electrode 500 is disposed on the side, facing away from the substrate 100, of the first gate 201 of the first transistor 200. The orthographic projection of the transparent connecting electrode 500 on the substrate 100 has an overlapping region with the orthographic projection of the pixel electrode 400 on the substrate 100, and has an overlapping region with the orthographic projection of the second conductor portion 202b of the first active layer 202 on the substrate 100. The pixel electrode 400 is lapped with the transparent connecting electrode 500, and the transparent connecting electrode 500 is lapped with the second conductor portion 202b of the first active layer 202. In this way, the pixel electrode 400 is electrically connected to the second conductor portion 202b of the first active layer 202 by means of the transparent connecting electrode 500. Since the film layer between the pixel electrode 400 and the first active layer 202 in the array substrate 000 is relatively thick, the distance between the pixel electrode 400 and the first active layer 202 is also relatively long. Therefore, when the transparent connecting electrode 500 is disposed between the pixel electrode 400 and the first active layer 202, and the pixel electrode 400 is lapped with the second conductor portion 202b of the first active layer 202 by means of the transparent connecting electrode 500, the risk of disconnection between the pixel electrode 400 and the second conductor portion 202b of the first active layer 202 is low when they are electrically connected to each other. In addition, the transparent connecting electrode 500 is made of a transparent conductive material, which does not affect the aperture ratio of the array substrate 000.

Figure 4:
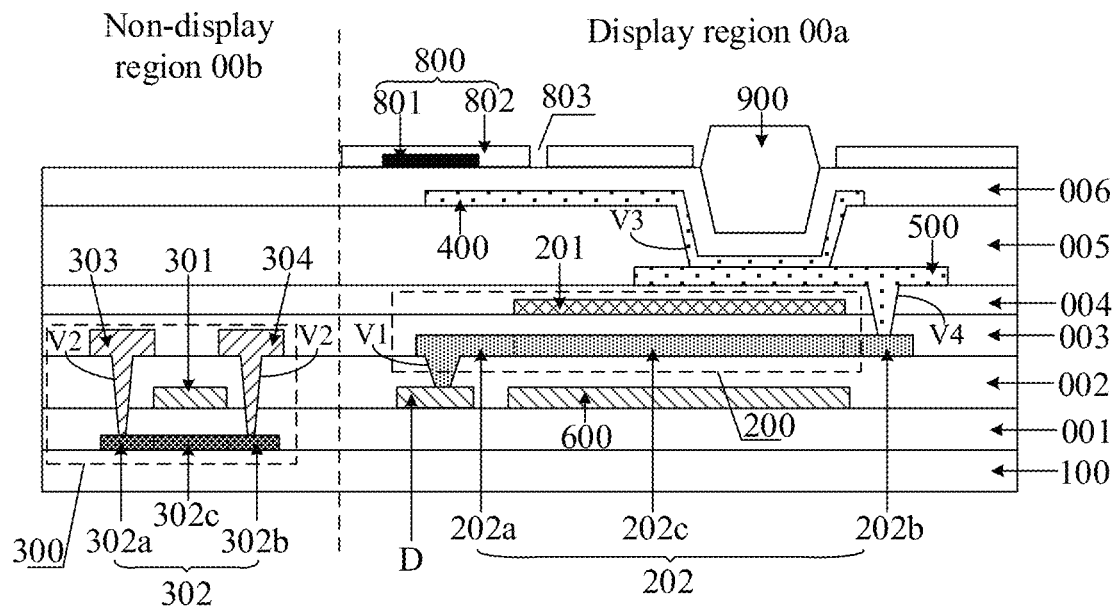
FIG. 4 is a schematic structural diagram of film layers in still another array substrate according to some embodiments of the present disclosure.

In the embodiments of the present disclosure, as shown in FIG. 4, FIG. 4 is a schematic structural diagram of film layers in still another array substrate according to some embodiments of the present disclosure. The array substrate 000 further includes a light shielding layer 600. The orthographic projection of the first channel region 202c of the first active layer 202 in the first transistor 200 on the substrate 100 is within the orthographic projection of the light shielding layer 600 on the substrate 100. In this way, light emitted to the first channel region 202c of the first active layer 202 is shielded by the light shielding layer 600, so as to prevent photon-generated carriers from generating in the first channel region 202c under the irradiation of light, thereby avoiding the current leakage phenomenon of the first transistor 200. It should be noted that, in other possible implementations, the light shielding layer 600 is not provided in products which do not require high electrical properties of the first transistor 200 and products in which the first active layer 201 of the first transistor 200 is made of a material with high optical stability, which can further improve the light transmittance of the array substrate 000.

In the present disclosure, in the array substrate 000, the light shielding layer 600 and the data line D are disposed in the same layer and made of the same material. In this way, on the premise of ensuring that the light shielding layer 600 can normally shield the light emitted to the first channel region 202c of the first active layer 202, the manufacturing process steps of the array substrate 000 are simplified, and the costs are reduced.

In some embodiments, the light shielding layer 600 in the array substrate 000 includes a plurality of light shielding blocks (not marked in the drawings) in one-to-one correspondence with the plurality of first transistors 200. The orthographic projection of the first channel region 202c of the first active layer 202 in each first transistor 200 on the substrate 100 is within the orthographic projection of the corresponding light shielding block on the substrate 100. In this way, it can be ensured that the light shielding layer 600 is only distributed at the position where the first channel region 202c is provided in the array substrate 000, and the light shielding layer 600 is not arranged at other positions, which ensures the high light transmittance of the array substrate 000.

In the embodiments of the present disclosure, there are a plurality of positional relationships between the first active layer 202 of the first transistor 200 and the second active layer 302 of the second transistor 300 in the array substrate 000, and the following two optional implementations are taken as examples for illustration in the embodiments of the present disclosure.

In a first optional implementation, as shown in FIG. 3 and FIG. 4, the first active layer 202 of the first transistor 200 is disposed in a different layer from the second active layer 302 of the second transistor 300, and the second active layer 302 of the second transistor 300 is closer to the substrate 100 than the second gate 301 is. That is, the second transistor 300 is a top-gate TFT. It should be noted that two structures being disposed in different layers in the present disclosure means that the two structures are not in the same film layer, and other film layer structures exist between the two structures. For example, the first active layer 202 and the second active layer 302 being disposed in different layers means that other film layer structures exist between the first active layer 202 and the second active layer 302.

In the embodiments of the present disclosure, the second transistor 300 further includes a source 303 and a drain 304 which are lapped with the second active layer 302. For example, the second active layer 302 includes a third conductor portion 302a and a fourth conductor portion 302b disposed opposite to each other, and a second channel region 302c between the third conductor portion 302a and the fourth conductor portion 302b. The third conductor portion 302a of the second active layer 302 is lapped with the source 303, the fourth conductor portion 302b of the second active layer 302 is lapped with the drain 304, and the orthographic projection of the second channel region 302c of the second active layer 302 on the substrate 100 is within the orthographic projection of the second gate 301 on the substrate 100. It should be noted that the working principle of the second transistor 300 is similar to that of the first transistor 200, and the working principle of the second transistor 300 is not repeated herein.

In the present disclosure, the source 303 and the drain 304 of the second transistor 300 are disposed in the same layer and made of the same material, and the source 303 and the drain 304 of the second transistor 300 are both disposed on the side of the second gate 301 facing away from the substrate 100.

It should be noted that the film layer positions of the source 303 and the drain 304 of the second transistor 300 in the array substrate 000 have various cases.

In a first case, as shown in FIG. 3 and FIG. 4, the source 303 and the drain 304 of the second transistor 300 are disposed in the same layer as the first active layer 202 of the first transistor 200, but the material of the first active layer 202 is different from the material of the source 303 and the drain 304 of the second transistor 300. It should be noted that two structures being disposed in the same layer but made of different materials in the present disclosure means that the two structures are disposed in the same film layer, but the materials are different. So, the two structures need to be formed in the same film layer by two patterning processes respectively. For example, the source 303 and the drain 304 of the second transistor 300 are usually made of a metal material, and the first active layer 202 of the first transistor 200 is made of an oxide semiconductor material.

In this case, the source 303 and the drain 304 of the second transistor 300 need to be lapped with the second active layer 302 through a via hole in the array substrate 000, and the first active layer 202 also needs to be lapped with the data line D through a via hole in the array substrate 000. Therefore, in the case that the source 303 and the drain 304 of the second transistor 300 are disposed in the same layer as the first active layer 202 of the first transistor 200, different types of via holes are formed in the array substrate 000 by one patterning process before the source 303, the drain 304 and the second active layer 302 are formed. In this way, the manufacturing difficulty of the array substrate 000 can be effectively reduced.

Exemplarily, the array substrate 000 further includes a first gate insulating layer 001 disposed between the second gate 301 and the second active layer 302 of the second transistor 300, and an auxiliary insulating layer 002 disposed between the first active layer 202 of the first transistor 200 and the data line D.

The array substrate 000 is provided with a first via hole V1 penetrating through the auxiliary insulating layer 002, and a plurality of lap joint via holes V2 penetrating through the auxiliary insulating layer 002 and the first gate insulating layer 001. The first active layer 202 of the first transistor 200 is lapped with the data line D through the first via hole V1.

The source 303 of the second transistor 300 is lapped with the second active layer 302 of the second transistor 300 through one lap joint via hole V2, and the drain 304 of the second transistor 300 is lapped with the second active layer 302 of the second transistor 300 through another lap joint via hole V2.

In the array substrate 000, the opening of the first via hole V1 facing away from the substrate 100 and the openings of the lap joint via holes V2 facing away from the substrate 100 are all on the surface of the auxiliary insulating layer 002 facing away from the substrate 100.

Therefore, in the manufacturing process of the array substrate 000, after the auxiliary insulating layer 002 is manufactured, one patterning process is performed on the auxiliary insulating layer 002 to form the first via hole V1 penetrating through the auxiliary insulating layer 002 and the plurality of lap joint via holes V2 penetrating through the auxiliary insulating layer 002 and the first gate insulating layer 001 in the array substrate 000. Subsequently, after the first active layer 202 of the first transistor 200 is formed, the first active layer 202 is lapped with the data line D through the first via hole V1; after the source 303 and the drain 304 of the second transistor 300 are formed, the source 303 is lapped with the second active layer 302 of the second transistor through one lap joint via hole V2, and the drain 304 is also lapped with the second active layer 302 of the second transistor through another lap joint via hole V2.

In some embodiments, the array substrate 000 further includes a second gate insulating layer 003 and an interlayer dielectric layer 004. The first gate insulating layer 001, the auxiliary insulating layer 002, the second gate insulating layer 003, and the interlayer dielectric layer 004 in the array substrate 000 are stacked in a direction perpendicular to and going away from the substrate 100.

The second active layer 302 of the second transistor 300 is disposed on the side of the first gate insulating layer 001 close to the substrate 100; the data line D and the second gate 301 of the second transistor 300 are both disposed between the first gate insulating layer 001 and the auxiliary insulating layer 002; the first active layer 202 of the first transistor 200, and the source 303 and the drain 304 of the second transistor 300 are all disposed between the auxiliary insulating layer 002 and the second gate insulating layer 003; and the first gate 201 of the first transistor 200 is disposed between the second gate insulating layer 003 and the interlayer dielectric layer 004.

Figure 5:
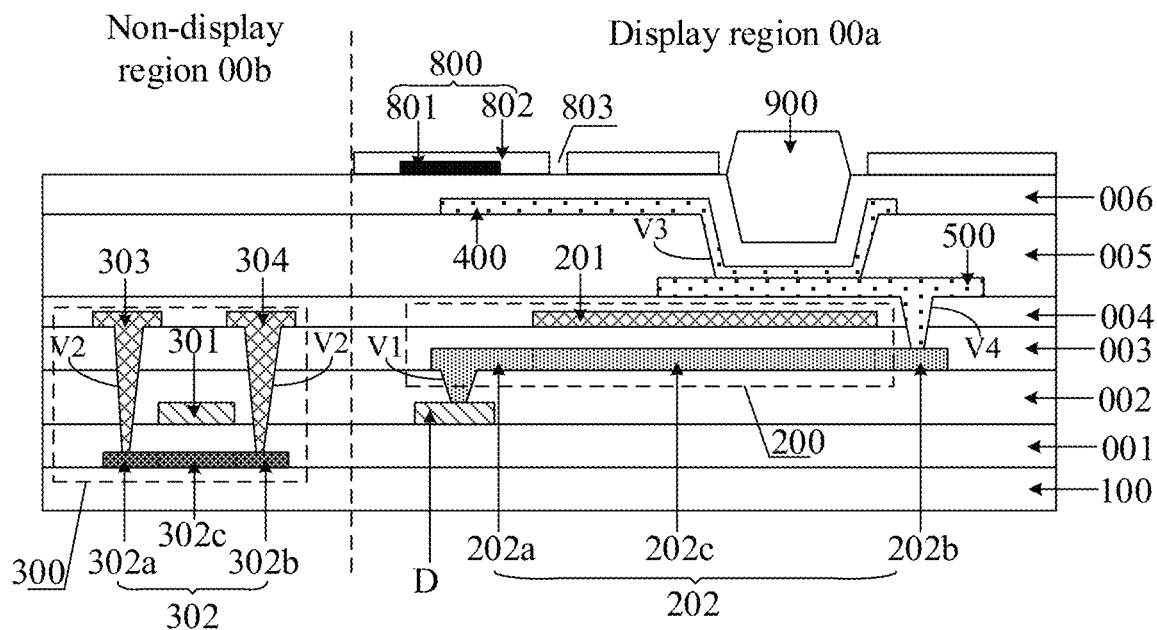
FIG. 5 is a schematic structural diagram of film layers in still another array substrate according to some embodiments of the present disclosure.

In a second case, as shown in FIG. 5, FIG. 5 is a schematic structural diagram of film layers in still another an array substrate according to some embodiments of the present disclosure. The source 303 and the drain 304 of the second transistor 300 are disposed in the same layer and made of the same material as the first gate 201 of the first transistor 200. In this way, the source 303 and the drain 304 of the second transistor 300 which are made of the metal material and the first gate 201 of the first transistor 200 which is made of the metal material can be simultaneously formed by the same one patterning process, which effectively increases the utilization ratio of the metal material in the process of forming the array substrate 000, thereby reducing the manufacturing cost of the array substrate 000.

In this case, the array substrate 000 also includes the first gate insulating layer 001, the auxiliary insulating layer 002, the second gate insulating layer 003, and the interlayer dielectric layer 004 which are stacked in the direction perpendicular to and going away from the substrate 100.

The second active layer 302 of the second transistor 300 is disposed on the side of the first gate insulating layer 001 close to the substrate 100; the data line D and the second gate 301 of the second transistor 300 are both disposed between the first gate insulating layer 001 and the auxiliary insulating layer 002; the first active layer 202 of the first transistor 200 is disposed between the auxiliary insulating layer 002 and the second gate insulating layer 003; and the first gate 201 of the first transistor 200, and the source 303 and the drain 304 of the second transistor 300 are all disposed between the second gate insulating layer 003 and the interlayer dielectric layer 004.

In addition, the array substrate 000 is further provided with a plurality of lap joint via holes V2 penetrating through the interlayer dielectric layer 004, the second gate insulating layer 003, the auxiliary insulating layer 002, and the first gate insulating layer 001. The source 303 of the second transistor 300 is lapped with the second active layer 302 of the second transistor 300 through one lap joint via hole V2, and the drain 304 of the second transistor 300 is lapped with the second active layer 302 of the second transistor 300 through another lap joint via hole V2.

Figure 6:
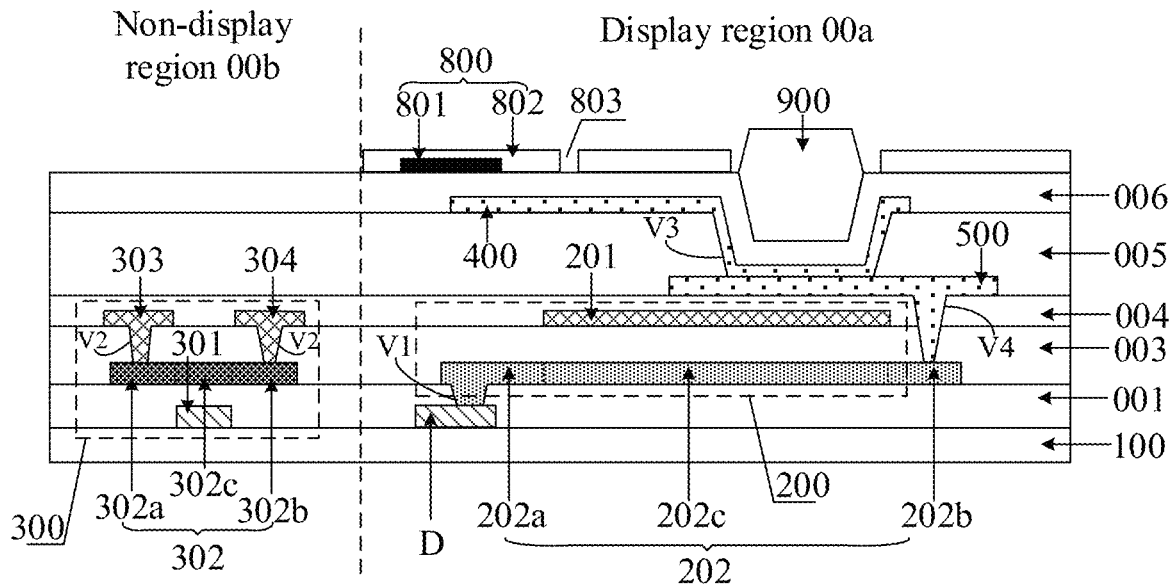
FIG. 6 is a schematic structural diagram of film layers in an array substrate according to some embodiments of the present disclosure.

In a second optional implementation, as shown in FIG. 6, FIG. 6 is a schematic structural diagram of film layers in an array substrate according to some embodiments of the present disclosure. The first active layer 202 of the first transistor 200 and the second active layer 302 of the second transistor 300 are disposed in the same layer but are made of different materials, and the second gate 301 of the second transistor 300 is closer to the substrate 100 than the second active layer 302 is. That is, the second transistor 300 is a bottom-gate TFT.

In the embodiments of the present disclosure, the second transistor 300 further includes a source 303 and a drain 304 which are lapped with the second active layer 302. For the structure of the second transistor 300, reference may be made to the descriptions in the foregoing embodiments, and details are not described herein again. The source 303 and the drain 304 of the second transistor 300 are disposed in the same layer and made of the same material as the first gate 201 of the first transistor 200. In this way, the manufacturing difficulty of the array substrate 000 can be reduced, and the manufacturing cost of the array substrate 000 can be reduced.

It should be noted that in the array substrate 000, the data line D is lapped with the first active layer 202 of the first transistor 200 in various manners. The embodiments of the present disclosure are illustrated by taking the following two possible cases as examples.

In a first possible case, as shown in FIG. 6, the array substrate 000 further includes a first gate insulating layer 001 disposed between the second gate 301 and the second active layer 302 of the second transistor 300. Since the data line D is disposed in the same layer as the second gate 301, and the second active layer 302 is disposed in the same layer as the first active layer 202, the film layer between the data line D and the first active layer 202 is also the first gate insulating layer 001. In this case, the array substrate 000 is provided with a first via hole V1 penetrating through the first gate insulating layer 001, and the first active layer 202 of the first transistor 200 is lapped with the data line D through the first via hole V1.

In some embodiments, the array substrate 000 further includes a second gate insulating layer 003 and an interlayer dielectric layer 004. The first gate insulating layer 001, the second gate insulating layer 003, and the interlayer dielectric layer 004 are stacked in the direction perpendicular to and going away from the substrate 100.

The second gate 301 of the second transistor 300 and the data line D are both disposed on the side of the first gate insulating layer 001 close to the substrate 100; the second active layer 302 of the second transistor 300 and the first active layer 202 of the first transistor 200 are both disposed between the first gate insulating layer 001 and the second gate insulating layer 003; and the first gate 201 of the first transistor 200, and the source 303 and the drain 304 of the second transistor 300 are all disposed between the second gate insulating layer 003 and the interlayer dielectric layer 004.

In this case, the array substrate 000 is further provided with a plurality of lap joint via holes V2 penetrating through the second gate insulating layer 003. The source 303 of the second transistor 300 is lapped with the second active layer 302 of the second transistor 300 through one lap joint via hole V2, and the drain 304 of the second transistor 300 is lapped with the second active layer 302 of the second transistor 300 through another lap joint via hole V2.

Figure 7:
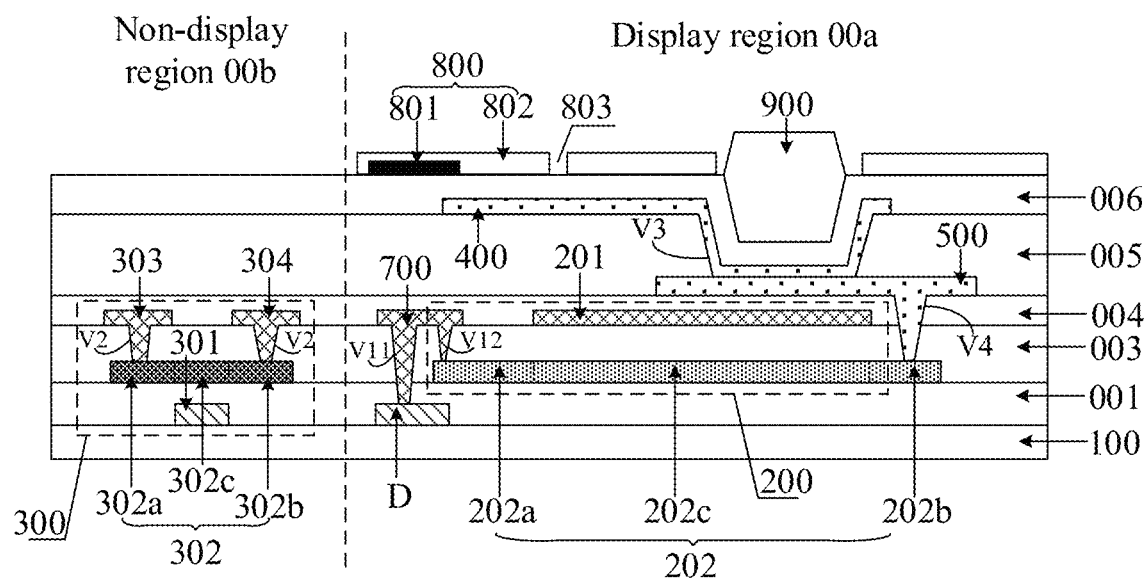
FIG. 7 is a schematic structural diagram of film layers in another array substrate according to some embodiments of the present disclosure.

In a second possible case, as shown in FIG. 7, FIG. 7 is a schematic structural diagram of film layers in another array substrate according to some embodiments of the present disclosure. The array substrate 000 further includes a connecting electrode 700. The connecting electrode 700 is lapped with the first active layer 202 of the first transistor 200 and the data line D. The connecting electrode 700, the first gate 201 of the first transistor 200, and the source 303 and the drain 304 of the second transistor 300 are disposed in the same layer and made of the same material.

In this case, the source 303 and the drain 304 of the second transistor 300 need to be lapped with the second active layer 302 through the via holes in the array substrate 000, and the connecting electrode 700 also needs to be lapped with the data line D and the first active layer 202 of the first transistor 200 through the via holes in the array substrate 000. Therefore, in the case that the connecting electrode 700 is disposed in the same layer as the source 303 and the drain 304 of the second transistor 300, different types of via holes are formed in the array substrate 000 by one patterning process before the source 303, the drain 304 and the connecting electrode 700 are formed. In this way, the manufacturing difficulty of the array substrate 000 can be effectively reduced. In addition, because the connecting electrode 700, the first gate 201 of the first transistor 200, and the source 303 and the drain 304 of the second transistor 300 are disposed in the same layer and made of the same material, the first active layer 202 is electrically connected to the data line D by disposing the connecting electrode 700, and the manufacturing difficulty of the array substrate 000 is not increased.

Exemplarily, the array substrate 000 further includes a first gate insulating layer 001 disposed between the second gate 301 and the second active layer 302 of the second transistor 300, and a second gate insulating layer 003 disposed between the first active layer 202 and the first gate 201 of the first transistor 200.

The array substrate 000 is provided with a first sub-via hole V11 penetrating through the second gate insulating layer 003 and the first gate insulating layer 001, and a second sub-via hole V12 and a plurality of lap joint via holes V2 penetrating through the second gate insulating layer 003. The connecting electrode 700 is lapped with the first active layer 202 of the first transistor 200 through the second sub-via hole V12, and the connecting electrode 700 is lapped with the data line D through the first sub-via hole V11. In this way, the first active layer 202 is electrically connected to the data line D through the connecting electrode 700. The source 303 of the second transistor 300 is lapped with the second active layer 302 of the second transistor 300 through one lap joint via hole V2, and the drain 304 of the second transistor 300 is lapped with the second active layer 302 of the second transistor 300 through another lap joint via hole V2.

The opening of the first sub-via hole V11 facing away from the substrate 100, the opening of the second sub-via hole V12 facing away from the substrate 100, and the openings of the lap joint via holes V2 facing away from the substrate 100 are all on the surface of the second gate insulating layer 003 facing away from the substrate.

Therefore, in the manufacturing process of the array substrate 000, after the second gate insulating layer 003 is manufactured, one patterning process is performed on the second gate insulating layer 003 to form the first sub-via hole V11 penetrating through the second gate insulating layer 003 and the first gate insulating layer 001, and the second sub-via hole V12 and the plurality of lap joint via holes V2 penetrating through the second gate insulating layer 003 in the array substrate 000. Subsequently, after the connecting electrode 700, and the source 303 and the drain 304 of the second transistor 300 are formed by one patterning process, the connecting electrode 700 is lapped with the first active layer 202 through the second sub-via hole V12 and is lapped with the data line D through the first sub-via hole V11, the source 303 is lapped with the second active layer 302 of the second transistor through one lap joint via hole V2, and the drain 304 is also lapped with the second active layer 302 of the second transistor through another lap joint via hole V2.

In some embodiments, the array substrate 000 further includes an interlayer dielectric layer 004. The first gate insulating layer 001, the second gate insulating layer 003, and the interlayer dielectric layer 004 in the array substrate 000 are stacked in the direction perpendicular to and going away from the substrate 100.

The second gate 301 of the second transistor 300 and the data line D are both disposed on the side of the first gate insulating layer 001 close to the substrate 100; the second active layer 302 of the second transistor 300 and the first active layer 202 of the first transistor 200 are both disposed between the first gate insulating layer 001 and the second gate insulating layer 003; and the first gate 201 of the first transistor 200, and the source 303 and the drain 304 of the second transistor 300 are all disposed between the second gate insulating layer 003 and the interlayer dielectric layer 004.

It should be noted that in the second optional implementation, when the first active layer 202 of the first transistor 200 and the second active layer 302 of the second transistor 300 are disposed in the same layer but made of different materials, the overall thickness of the array substrate 000 can be reduced. For example, there is no need to provide the auxiliary insulating layer in the array substrate 000 in this case. In this way, it can be ensured that the overall stress in the array substrate 000 is low, which can reduce the probability of warpage at the edge of the array substrate 000, thereby effectively improving the yield of the array substrate 000.

In the embodiments of the present disclosure, as shown in FIG. 3 to FIG. 7, the transparent connecting electrode 500 in the array substrate 000 is disposed on the side of the interlayer dielectric layer 004 facing away from the substrate 100. The array substrate 000 further includes a planarization layer 005 disposed on the side of the transparent connecting electrode 500 facing away from the substrate 100. The pixel electrode 400 in the array substrate 000 is disposed on the side of the planarization layer 005 facing away from the substrate 100.

The array substrate 000 is further provided with a connecting via hole V3 penetrating through the planarization layer 005, and a second via hole V4 penetrating through the interlayer dielectric layer 004 and the second gate insulating layer 003. The pixel electrode 400 is lapped with the transparent connecting electrode 500 through the connecting via hole V3, and the transparent connecting electrode 500 is lapped with the first active layer 202 of the first transistor 200 through the second via hole V4. For example, the transparent connecting electrode 500 is lapped with the second conductor portion 202b of the first active layer 202 through the second via hole V4. In this way, it is ensured that the risk of disconnection between the pixel electrode 400 and the second conductor portion 202b of the first active layer 202 is low when they are electrically connected to each other, without affecting the aperture ratio of the array substrate 000.

In some embodiments, as shown in FIG. 3 to FIG. 7, the array substrate 000 further includes a passivation layer 006 disposed on the side of the pixel electrode 400 facing away from the substrate 100, and a common electrode layer 800 disposed on the side of the passivation layer 006 facing away from the substrate 100. In this way, the pixel electrode 400 and the common electrode layer 800 can be integrated simultaneously in the array substrate 000, thereby improving the integration level of the array substrate 000. In a display panel integrated with the array substrate 000, when an electric field is formed between the pixel electrode 400 and the common electrode layer 800 disposed in the array substrate 000, the electric field can drive liquid crystals in the display panel to rotate, and the display panel can display a corresponding image.

In the embodiments of the present disclosure, the common electrode layer 800 includes a light shielding portion 801 and a transparent conductive portion 802 disposed on the side of the light shielding portion 801 facing away from the substrate 100. The orthographic projection of the light shielding portion 801 of the common electrode layer 800 on the substrate 100 is not overlapped with the orthographic projection of the pixel electrode 400 on the substrate 100. For example, the orthographic projection of the light shielding portion 801 of the common electrode layer 800 on the substrate 100 is in a mesh shape, and the orthographic projection of the light shielding portion 801 on the substrate 100 is between the orthographic projections of two adjacent pixel electrodes 400 on the substrate 100. After the array substrate 000 is integrated in the display device, the light shielding portion 801 of the common electrode layer 800 can shield the light emitted to the adjacent sub-pixel region 00c among the light emitted from a sub-pixel region 00c in the array substrate 000, thereby effectively reducing the probability of cross color occurring in the display device, and ensuring a good display effect of the display device.

In the present disclosure, the orthographic projection of the data line D on the substrate 100 and the orthographic projection of the gate line G on the substrate 100 are within the orthographic projection of the light shielding portion 801 of the common electrode layer 800 on the substrate 100. In addition, in the extending direction of the gate line G, the width of the light shielding portion 801 is greater than the width of the data line D; and in the extending direction of the data line D, the width of the light shielding portion 801 is greater than the width of the gate line G. Therefore, the light shielding portion 801 can shield the data line D and the gate line G, which can reduce the probability that the ambient light emitted to the array substrate is reflected by the data line D and the gate line G, thereby effectively reducing the probability that the array substrate reflects the ambient light.

It should be noted that, when the light shielding portion 801 is disposed in the common electrode layer 800, the light shielding portion 801 serves as a black matrix. Therefore, a black matrix is not provided in the color filter substrate of the display panel, which can effectively simplify the manufacturing process of the color filter substrate. Certainly, a black matrix may also be normally provided in the color filter substrate, which is not limited in the embodiments of the present disclosure.

In some embodiments, the transparent conductive portion 802 of the common electrode layer 800 is a transparent planar electrode disposed on the entire layer. As such, the transparent conductive portion 802 covers the light shielding portion 801. For example, the transparent conductive portion 802 of the common electrode layer 800 is made of a transparent conductive material such as indium zinc oxide (ITO) or indium tin oxide (ITO). In the present disclosure, the transparent conductive portion 802 of the common electrode layer 800 has a slit 803. The light transmittance of the array substrate 000 is further improved by forming the slit in the transparent conductive portion 802.

In the embodiments of the present disclosure, the light shielding portion 801 of the common electrode layer 800 is made of a conductive material, and certainly can also be made of a non-conductive material. Exemplarily, when the light shielding portion 801 of the common electrode layer 800 is made of a conductive material, the conductive material is a metal material such as molybdenum, titanium, aluminum or an alloy. In this case, because the resistivity of these conductive materials is generally lower than the resistivity of the transparent conductive material, the resistance of the transparent conductive portion 802 of the common electrode layer 800 is reduced by means of the light shielding portion 801, thereby ensuring that the potentials applied to various positions of the common electrode layer 800 are approximately the same. It should be noted that the light shielding portion 801 made of the metal material has certain light reflectivity. In order to reduce the reflectivity of the light shielding portion 801 to ambient light, the metal material is blackened. In this way, on the premise of ensuring that the light shielding portion 801 formed subsequently can normally shield light, the reflectivity of the light shielding portion 801 to ambient light is reduced. For example, when the metal material is molybdenum, after molybdenum is blackened, molybdenum becomes black molybdenum oxide. Molybdenum oxide also has certain conductivity.

When the light shielding portion 801 of the common electrode layer 800 is made of a non-conductive material, the non-conductive material is an organic material such as a black matrix material or an inorganic material such as a carbon material.

In other possible implementations, the common electrode layer 800 only includes the transparent conductive portion 802, that is, the common electrode layer 800 is a planar electrode disposed on the entire layer.

In some embodiments, the array substrate 000 further includes a support part 900. A portion of the support part 900 is disposed in the connecting via hole V3, and the other portion is disposed outside the connecting via hole V3. The portion of the support part 900 which is disposed outside the connecting via hole V3 is in contact with the color filter substrate to support the color filter substrate, so as to ensure a good stability of the process of aligning the array substrate 000 with the color filter substrate to form the display panel.

In summary, the array substrate provided in the embodiments of the present disclosure includes a substrate, and a first transistor, a second transistor, a data line, and a pixel electrode that are disposed on the substrate. The data line in the array substrate is disposed on the side, close to the substrate, of the first active layer of the first transistor, the first gate of the first transistor in the array substrate is disposed on the side, facing away from the substrate, of the first active layer, and the pixel electrode in the array substrate is disposed on the side, facing away from the substrate, of the first gate of the first transistor. Therefore, it can be ensured that in the direction perpendicular to the substrate, the vertical distance between the data line and the pixel electrode is relatively big, thereby ensuring that the parasitic capacitance generated between the data line and the pixel electrode is small. Thus, the probability that the parasitic capacitor interferes with the data signal loaded on the data line is low, and the data signal loaded on the data line can be normally transmitted to the pixel electrode, thereby effectively reducing the power consumption of the array substrate. In addition, in the array substrate, the data line and the gate of the second transistor are disposed in the same layer and made of the same material, which can effectively reduce the manufacturing difficulty of the array substrate on the premise of ensuring the small parasitic capacitance generated between the data line and the pixel electrode.

The embodiments of the present disclosure further provide a method of manufacturing an array substrate. The method of manufacturing the array substrate is used to manufacture the array substrate as shown in FIG. 1. The method of manufacturing the array substrate includes forming a first transistor, a second transistor, a data line, and a pixel electrode on a substrate.

The array substrate includes a display region and a non-display region located at the periphery of the display region. The first transistor is disposed in the display region, and the second transistor is disposed in the non-display region. The first transistor includes a first gate and a first active layer, and the first gate is disposed on the side of the first active layer facing away from the substrate. The second transistor includes a second active layer and a second gate. The data line and the pixel electrode are both disposed in the display region. The data line is disposed on the side of the first active layer close to the substrate, and the data line is lapped with the first active layer; and the pixel electrode is disposed on the side of the first gate facing away from the substrate, and the pixel electrode is lapped with the first active layer. The data line and the second gate are disposed in the same layer and made of the same material.

In summary, the method of manufacturing the array substrate provided in the embodiments of the present disclosure includes forming a first transistor, a second transistor, a data line and a pixel electrode on a substrate. The data line in the array substrate is disposed on the side, close to the substrate, of the first active layer of the first transistor, the first gate of the first transistor in the array substrate is disposed on the side, facing away from the substrate, of the first active layer, and the pixel electrode in the array substrate is disposed on the side, facing away from the substrate, of the first gate of the first transistor. Therefore, it can be ensured that in the direction perpendicular to the substrate, the vertical distance between the data line and the pixel electrode is relatively big, thereby ensuring that the parasitic capacitance generated between the data line and the pixel electrode is small. Thus, the probability that the parasitic capacitor interferes with the data signal loaded on the data line is low, and the data signal loaded on the data line can be normally transmitted to the pixel electrode, thereby effectively reducing the power consumption of the array substrate. In addition, in the array substrate, the data line and the gate of the second transistor are disposed in the same layer and made of the same material, which can effectively reduce the manufacturing difficulty of the array substrate on the premise of ensuring the small parasitic capacitance generated between the data line and the pixel electrode.

Figure 8:
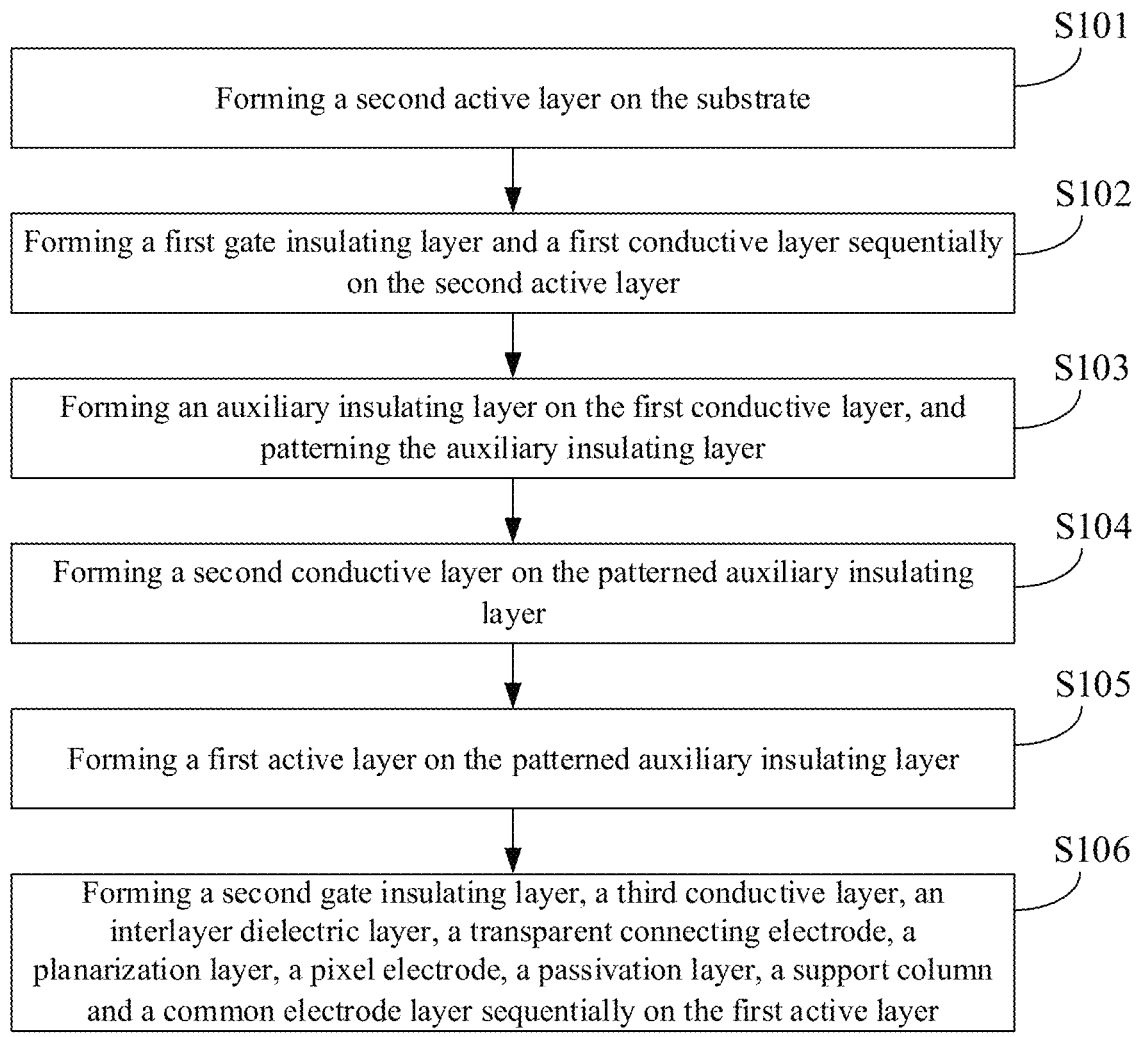
FIG. 8 shows a method of manufacturing an array substrate according to some embodiments of the present disclosure.

Referring to FIG. 8, FIG. 8 shows a method of manufacturing an array substrate according to some embodiments of the present disclosure. The method of manufacturing the array substrate is used to manufacture the array substrate shown in FIG. 3 or FIG. 4 in the above embodiments. The method of manufacturing the array substrate includes the following steps.

In step S101, a second active layer is formed on the substrate.

In some embodiments, the second active layer is made of an LTPS semiconductor material.

Figure 9:
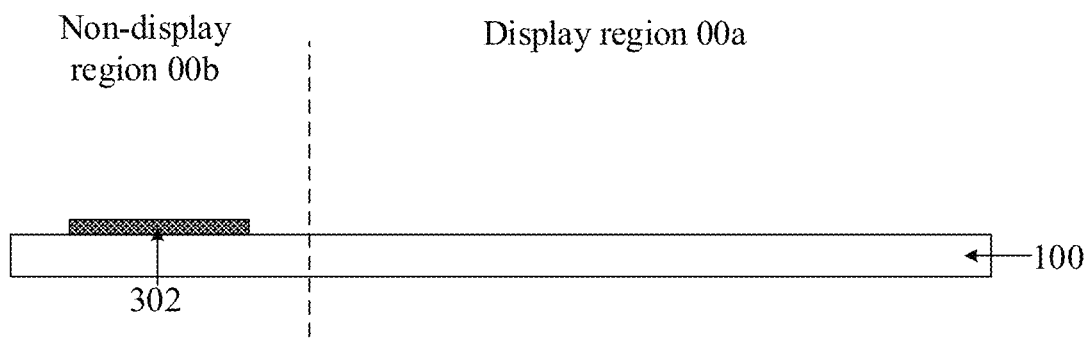
FIG. 9 is a schematic diagram of formation of a second active layer on a substrate according to some embodiments of the present disclosure.

Exemplarily, referring to FIG. 9, FIG. 9 is a schematic diagram of formation of a second active layer on a substrate according to some embodiments of the present disclosure. A thin film made of the LTPS semiconductor material is formed on a side of the substrate 100 by any one of deposition, coating, sputtering and the like, and then a one-time patterning process is performed on the thin film to form the second active layer 302. Here, the second active layer 302 is only disposed in the non-display region 00*b*.

In step S102, a first gate insulating layer and a first conductive layer are sequentially formed on the second active layer.

In some embodiments, the first gate insulating layer is made of silicon oxide, silicon nitride, or a mixture of silicon oxide and silicon nitride, and the thickness of the first gate insulating layer ranges from 600 Å to 2000 Å. The first conductive layer is made of a metal material such as aluminum, molybdenum or an alloy.

Figure 10:
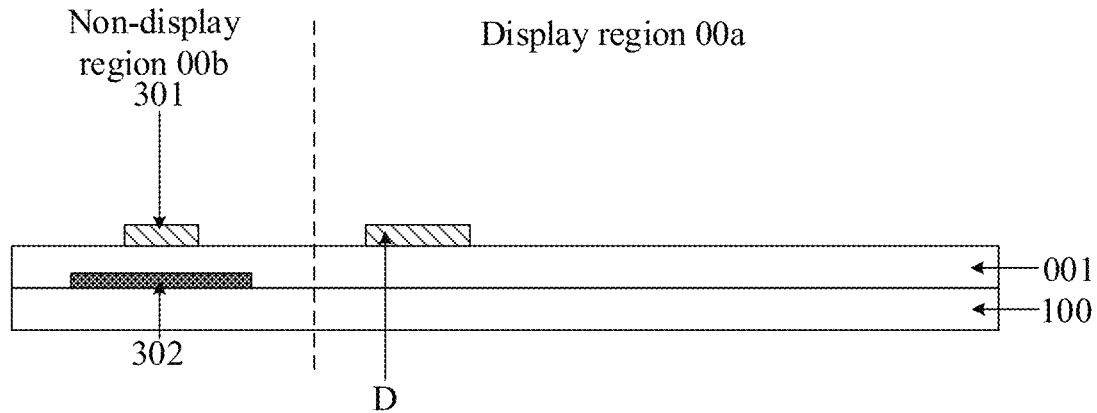
FIG. 10 is a schematic diagram of formation of a first gate insulating layer and a first conductive layer sequentially on a second active layer according to some embodiments of the present disclosure.

Exemplarily, referring to FIG. 10, FIG. 10 is a schematic diagram of formation of the first gate insulating layer and the first conductive layer sequentially on the second active layer according to some embodiments of the present disclosure. The first gate insulating layer 001 and a first conductive thin film which is made of the metal material are sequentially formed on the side of the second active layer 302 facing away from the substrate 100 by any one of deposition, coating, sputtering and the like, and then the one-time patterning process is performed on the first conductive thin film to form the first conductive layer. Here, the first conductive layer includes a second gate 301 disposed in the non-display region 00*b* and a data line D disposed in the display region 00*a*. In other possible implementations, the first conductive layer further includes a light shielding layer 600 disposed in the display region 00*a*.

When the first conductive layer only includes the second gate 301 and the data line D, the array substrate shown in FIG. 3 is manufactured. When the first conductive layer includes not only the second gate 301 and the data line D but also the light shielding layer 600, the array substrate shown in FIG. 4 is manufactured.

In step S103, an auxiliary insulating layer is formed on the first conductive layer, and the auxiliary insulating layer is patterned.

In some embodiments, the thickness of the auxiliary insulating layer ranges from 2000 Å to 8000 Å. The auxiliary insulating layer is a single-layered insulating layer, or a plurality of stacked insulating layers. When the auxiliary insulating layer is a single-layered insulating layer, the auxiliary insulating layer is made of silicon dioxide. When the auxiliary insulating layer is a plurality of stacked insulating layers, these insulating layers include an insulating layer made of silicon oxide, an insulating layer made of silicon nitride, an insulating layer made of silicon dioxide, and the like. In addition, it should be ensured that the insulating layer farthest from the substrate 100 in the plurality of stacked insulating layers is an insulating layer made of silicon dioxide. In this case, since silicon dioxide has good compactness, it can be ensured that the first active layer made of the oxide semiconductor material subsequently formed on the auxiliary insulating layer is not conductorized, thereby ensuring the good electrical properties of the first transistor which is subsequently formed.

Figure 11:
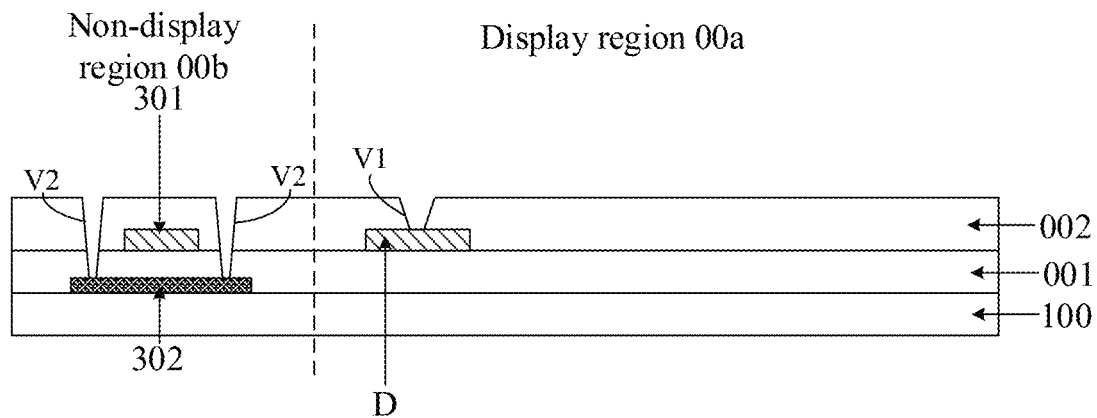
FIG. 11 is a schematic diagram of formation of an auxiliary insulating layer on a first conductive layer according to some embodiments of the present disclosure.

Exemplarily, referring to FIG. 11, FIG. 11 is a schematic diagram of formation of the auxiliary insulating layer on the first conductive layer according to some embodiments of the present disclosure. The auxiliary insulating layer 002 is formed on the side of the first conductive layer facing away from the substrate 100 by any one of deposition, coating, sputtering and the like, and then the one-time patterning process is performed on the auxiliary insulating layer 002 to form a first via hole V1 and lap joint via holes V2. The first via hole V1 is in the display region 00*a*, and the first via hole V1 penetrates through the auxiliary insulating layer 002. The lap joint via holes V2 are in the non-display region 00*b*, and the lap joint via holes V2 sequentially penetrate through the auxiliary insulating layer 002 and the first gate insulating layer 001.

In step S104, a second conductive layer is formed on the patterned auxiliary insulating layer.

In some embodiments, the thickness of the second conductive layer ranges from 2000 Å to 8000 Å. The second conductive layer is made of a metal material such as aluminum, molybdenum or an alloy.

Figure 12:
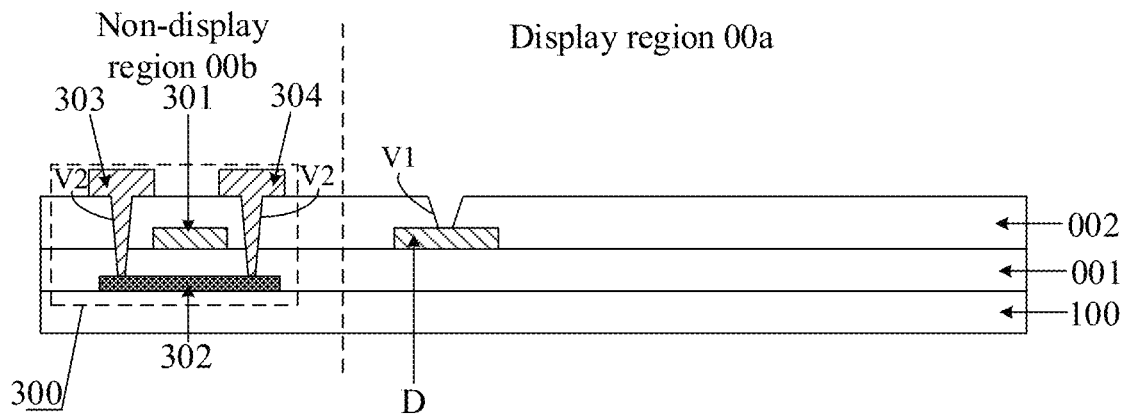
FIG. 12 is a schematic diagram of formation of a second conductive layer according to some embodiments of the present disclosure.

Exemplarily, referring to FIG. 12, FIG. 12 is a schematic diagram of formation of the second conductive layer according to some embodiments of the present disclosure. A second conductive thin film is formed on the side of the patterned auxiliary insulating layer 002 facing away from the substrate 100 by any one of deposition, coating, sputtering and the like, and then the one-time patterning process is performed on the second conductive thin film to form the second conductive layer. Here, the second conductive layer is only disposed in the non-display region 00*b*, and the second conductive layer includes a source 303 and a drain 304. The source 303 and the drain 304 are both lapped with the second active layer 302 through the lap joint via holes V2. In this way, the source 303, the drain 304, the second gate 301 and the second active layer 302 form a second transistor 300 disposed in the non-display region 00*b*.

In step S105, a first active layer is formed on the patterned auxiliary insulating layer.

In some embodiments, the thickness of the first active layer ranges from 150 Å to 1500 Å. The first active layer is made of an oxide semiconductor material.

Figure 13:
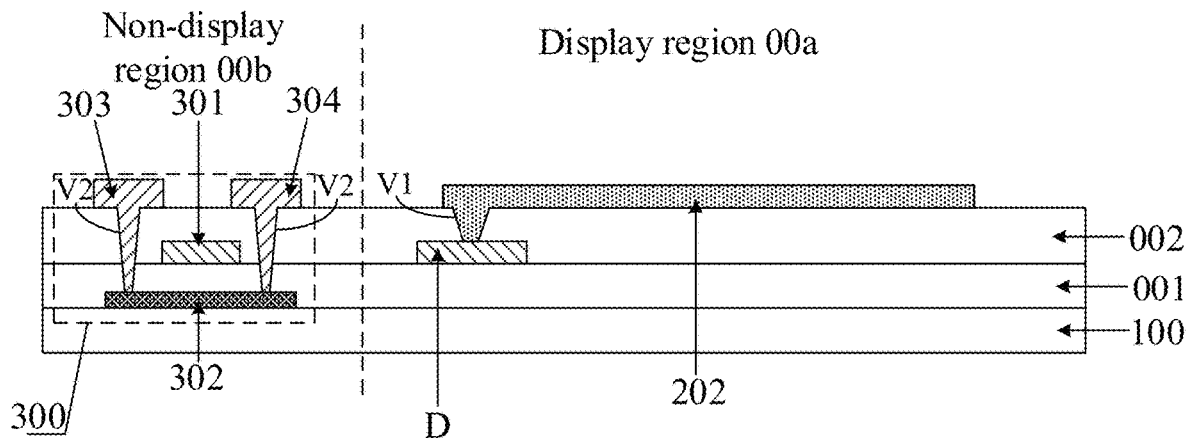
FIG. 13 is a schematic diagram of formation of a first active layer according to some embodiments of the present disclosure.

Exemplarily, referring to FIG. 13, FIG. 13 is a schematic diagram of formation of the first active layer according to some embodiments of the present disclosure. A thin film made of the oxide semiconductor material is formed on the side of the patterned auxiliary insulating layer 002 facing away from the substrate 100 by any one of deposition, coating, sputtering, and the like, and then the one-time patterning process is performed on the thin film to form the first active layer 202. Here, the first active layer 202 is only disposed in the display region 00a, and the first active layer 202 is lapped with the data line D through the first via hole V1.

In step S106, a second gate insulating layer, a third conductive layer, an interlayer dielectric layer, a transparent connecting electrode, a planarization layer, a pixel electrode, a passivation layer, a support part and a common electrode layer are sequentially formed on the first active layer.

In the embodiments of the present disclosure, the second gate insulating layer, the third conductive layer, the interlayer dielectric layer, the transparent connecting electrode, the planarization layer, the pixel electrode, the passivation layer, the support part and the common electrode layer are sequentially formed on the substrate on which the first active layer is formed. The second gate insulating layer is made of silicon dioxide, which can prevent the first active layer made of the oxide semiconductor material from being conductorized. The third conductive layer includes a first gate disposed in the display region. The first gate and the first active layer form a first transistor disposed in the display region. In this way, the array substrate 000 shown in FIG. 3 or FIG. 4 is formed. It should be noted that these preparation processes are conventional processes, and thus are not repeated herein.

Figure 14:
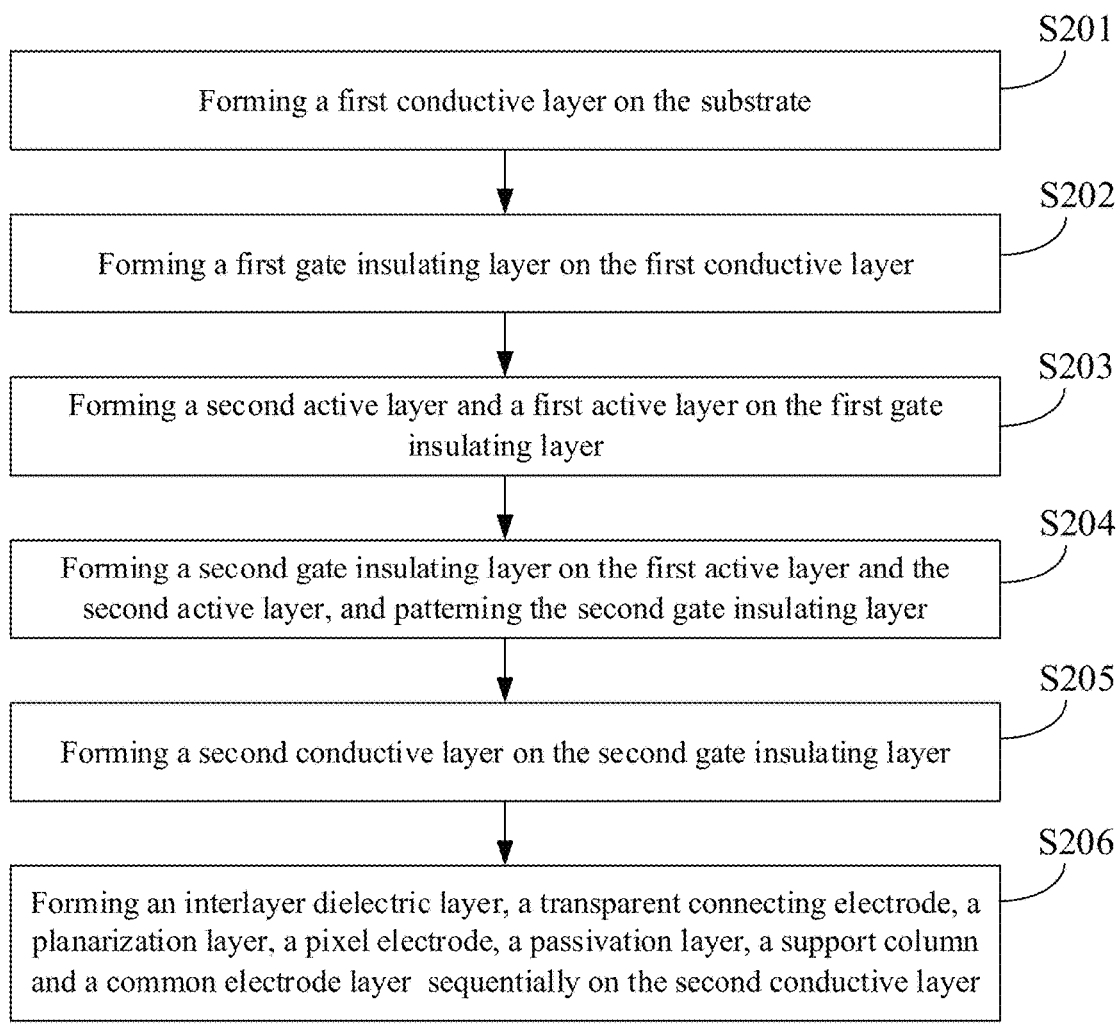
FIG. 14 shows a method of manufacturing an array substrate according to some embodiments of the present disclosure.

Referring to FIG. 14, FIG. 14 shows a method of manufacturing an array substrate according to some embodiments of the present disclosure. The method of manufacturing the array substrate is used to manufacture the array substrate shown in FIG. 7 in the above embodiments. The method of manufacturing the array substrate includes the following steps.

In step S201, a first conductive layer is formed on a substrate.

In some embodiments, the first conductive layer is made of a metal material such as aluminum, molybdenum or an alloy.

Figure 15:
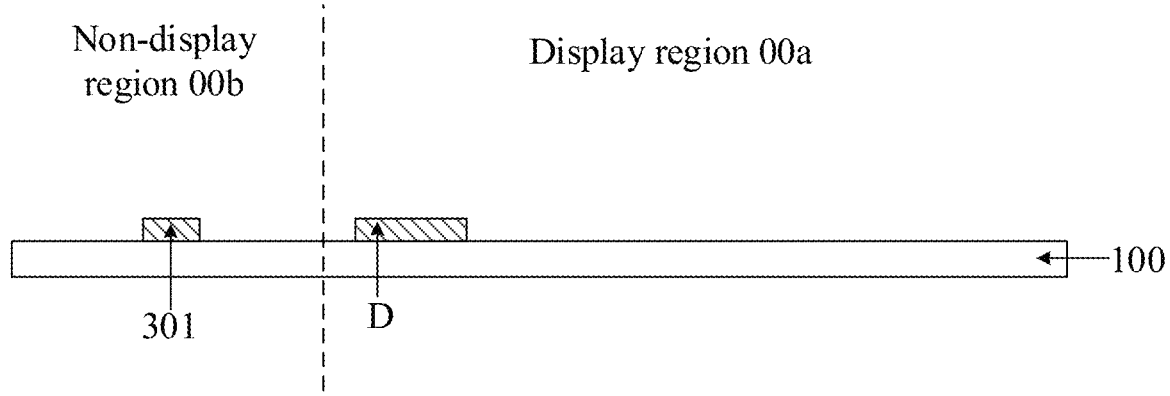
FIG. 15 is a schematic diagram of formation of a first conductive layer according to some embodiments of the present disclosure.

Exemplarily, referring to FIG. 15, FIG. 15 is a schematic diagram of formation of the first conductive layer according to some embodiment of the present disclosure. A first conductive thin film made of the metal material is formed on a side of the substrate 100 by any one of deposition, coating, sputtering and the like, and then the one-time patterning process is performed on the first conductive thin film to form the first conductive layer. Here, the first conductive layer includes a second gate 301 disposed in the non-display region 00b, and a data line D disposed in the display region 00a.

In step S202, a first gate insulating layer is formed on the first conductive layer.

In some embodiments, the thickness of the first gate insulating layer ranges from 1000 Å to 6000 Å. The first gate insulating layer is a single-layered insulating layer, or a plurality of stacked insulating layers. When the first gate insulating layer is a single-layered insulating layer, the first gate insulating layer is made of silicon dioxide. When the first gate insulating layer is a plurality of stacked insulating layers, these insulating layers include an insulating layer made of silicon oxide, an insulating layer made of silicon nitride, an insulating layer made of silicon dioxide, and the like. In addition, it should be ensured that the insulating layer farthest from the substrate 100 in the plurality of stacked insulating layers is an insulating layer made of silicon dioxide. In this case, since silicon dioxide has good compactness, it can be ensured that the first active layer made of the oxide semiconductor material subsequently formed on the first gate insulating layer is not conductorized, thereby ensuring the good electrical properties of the first transistor which is subsequently formed.

Figure 16:
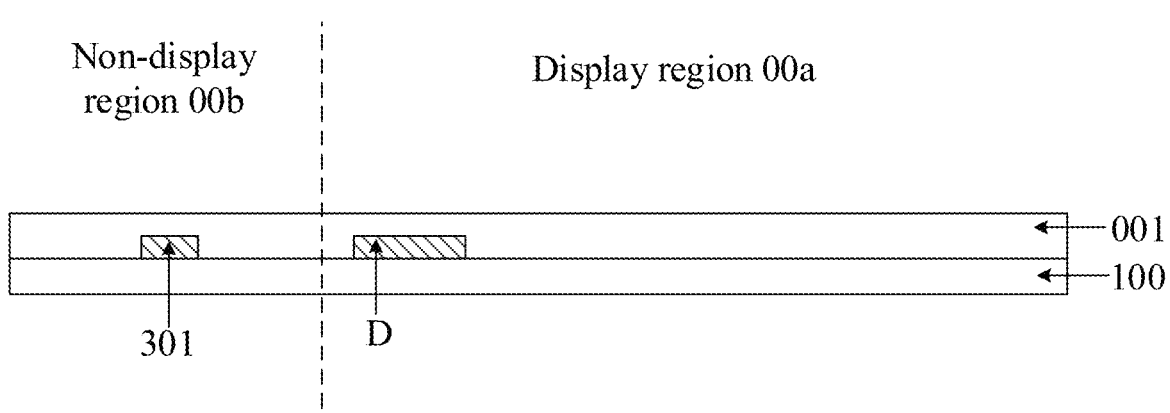
FIG. 16 is a schematic diagram of formation of a first gate insulating layer on a first conductive layer according to some embodiments of the present disclosure.

Exemplarily, referring to FIG. 16, FIG. 16 is a schematic diagram of formation the first gate insulating layer on the first conductive layer according to some embodiments of the present disclosure. The first gate insulating layer 001 is formed on the side of the first conductive layer facing away from the substrate 100 by any one of deposition, coating, sputtering, and the like.

In step S203, a second active layer and a first active layer are respectively formed on the first gate insulating layer.

In some embodiments, the second active layer is made of an LTPS semiconductor material, and the first active layer is made of an oxide semiconductor material.

Figure 17:
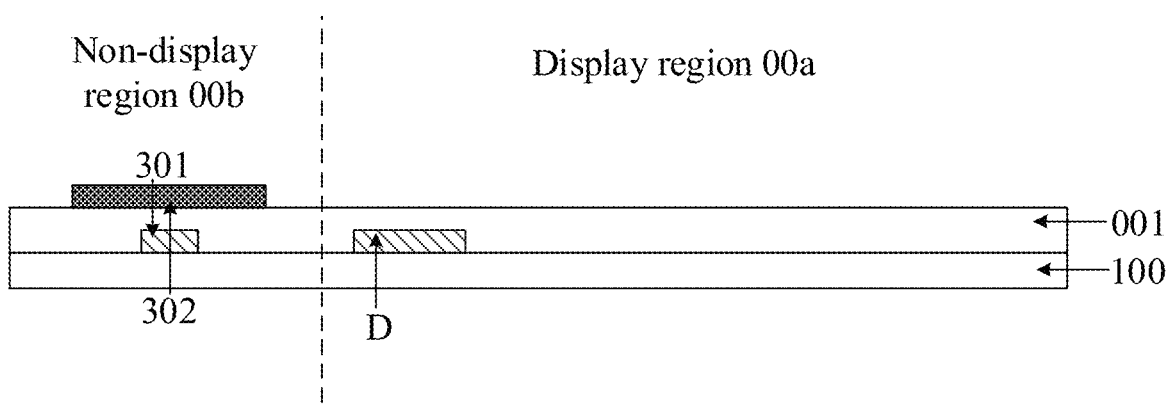
FIG. 17 is a schematic diagram of formation of a second active layer on a first gate insulating layer according to some embodiments of the present disclosure.

Exemplarily, referring to FIG. 17, FIG. 17 is a schematic diagram of formation of the second active layer on the first gate insulating layer according to some embodiment of the present disclosure. A thin film made of the LTPS semiconductor material is formed on the side of the first gate insulating layer 001 facing away from the substrate 100 by any one of deposition, coating, sputtering and the like, and then the one-time patterning process is performed on the thin film to form the second active layer 302. Here, the second active layer 302 is only disposed in the non-display region 00b.

Figure 18:
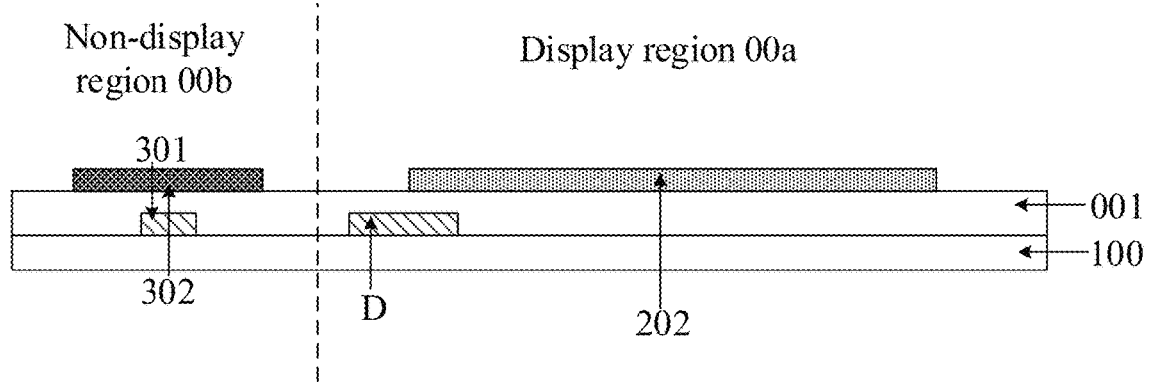
FIG. 18 is a schematic diagram of formation of a first active layer on a first gate insulating layer according to some embodiments of the present disclosure.

Referring to FIG. 18, FIG. 18 is a schematic diagram of formation of the first active layer on the first gate insulating layer according to some embodiments of the present disclosure. A thin film made of the oxide semiconductor material is formed on the side of the first gate insulating layer 001 facing away from the substrate 100 by any one of deposition, coating, sputtering and the like, and then the one-time patterning process is performed on the thin film to form the first active layer 202. Here, the first active layer 202 is disposed in the display region 00a.

In step S204, a second gate insulating layer is formed on the first active layer and the second active layer, and the second gate insulating layer is patterned.

In some embodiments, the second gate insulating layer is made of silicon oxide, silicon nitride, or a mixture of silicon oxide and silicon nitride.

Figure 19:
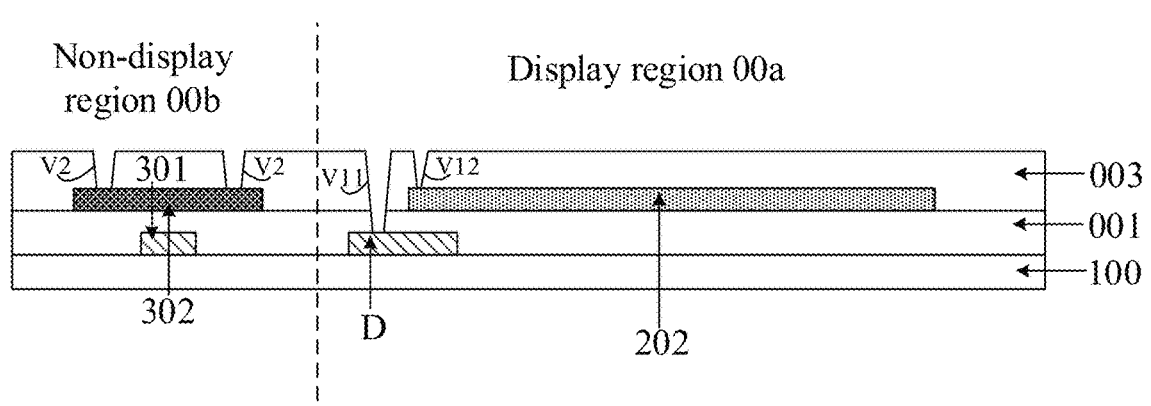
FIG. 19 is a schematic diagram of formation of a second gate insulating layer on a first active layer and a second active layer according to some embodiments of the present disclosure.

Exemplarily, referring to FIG. 19, FIG. 19 is a schematic diagram of formation of the second gate insulating layer on the first active layer and the second active layer according to some embodiments of the present disclosure. The second gate insulating layer 003 is formed on the side, facing away from the substrate 100, of the first active layer 202 and the second active layer 302 by any one of deposition, coating, sputtering, and the like, and then the one-time patterning process is performed on the second gate insulating layer 003 to form lap joint via holes V2, a first sub-via hole V11, and a second sub-via hole V12. The lap joint via holes V2 are in the non-display region 00b, and the lap joint via holes V2 penetrate through the second gate insulating layer 003. The first sub-via hole V11 and the second sub-via hole V12 are in the display region 00a, the first sub-via hole V11 sequentially penetrates through the second gate insulating layer 003 and the first gate insulating layer 001, and the second sub-via hole V12 penetrates through the second gate insulating layer 003.

In step S205, a second conductive layer is formed on the second gate insulating layer.

In some embodiments, the second conductive layer is made of a metal material such as aluminum, molybdenum or an alloy.

Figure 20:
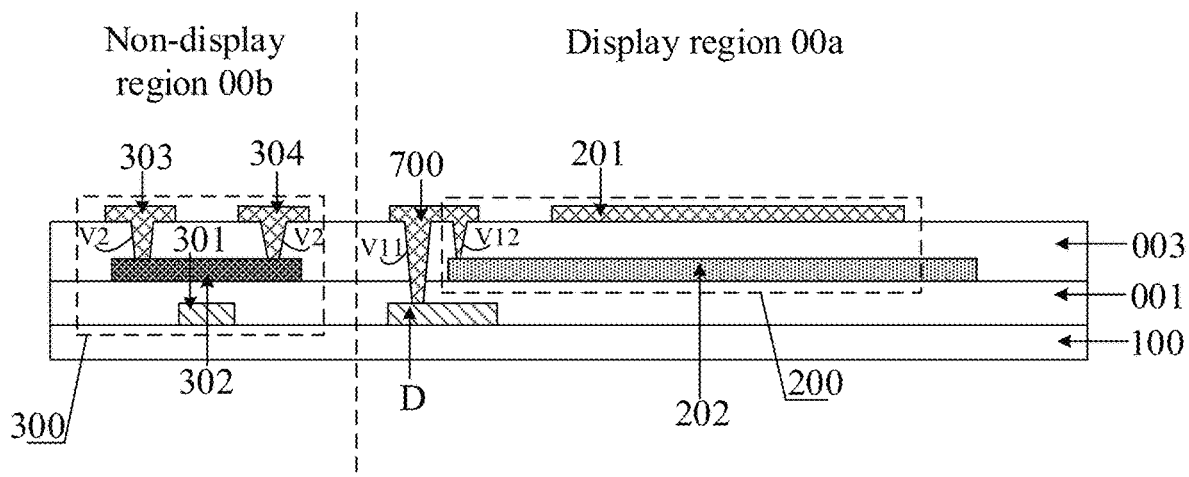
FIG. 20 is a schematic diagram of formation of a second conductive layer on a second gate insulating layer according to some embodiments of the present disclosure.

Exemplarily, referring to FIG. 20, FIG. 20 is a schematic diagram of formation of the second conductive layer on the second gate insulating layer according to some embodiment of the present disclosure. A second conductive thin film is formed on the side of the patterned second gate insulating layer 003 facing away from the substrate 100 by any one of deposition, coating, sputtering and the like, and then the one-time patterning process is performed on the second conductive thin film to form the second conductive layer. Here, the second conductive layer includes a source 303 and a drain 304 that are disposed in the non-display region 00b, and a connecting electrode 700 and a first gate 201 that are disposed in the display region 00a. The source 303 and the drain 304 are lapped with the second active layer 302 through the lap joint via holes V2. In this way, the source 303, the drain 304, the second gate 301, and the second active layer 302 form the second transistor 300 disposed in the non-display region 00b. The first gate 201 is insulated from the first active layer 202, and the first gate 201 and the first active layer 202 form the first transistor 200 disposed in the display region 00a. The connecting electrode 700 is lapped with the first active layer 202 and the data line D through the second sub-via hole V12 and the first sub-via hole V11 respectively. In this way, the first active layer 202 is lapped with the data line D through the connecting electrode 700.

In step S206, an interlayer dielectric layer, a transparent connecting electrode, a planarization layer, a pixel electrode, a passivation layer, a support part and a common electrode layer are sequentially formed on the second conductive layer.

In the embodiments of the present disclosure, the interlayer dielectric layer, the transparent connecting electrode, the planarization layer, the pixel electrode, the passivation layer, the support part and the common electrode layer are sequentially formed on the substrate on which the second conductive layer is formed. In this way, the array substrate 000 shown in FIG. 7 can be formed. It should be noted that the preparation processes are conventional processes, and thus are not repeated herein.

It should be further noted that the one-time patterning process in the above embodiments includes photoresist coating, exposure, development, etching and photoresist stripping. For the working principle of the array substrate prepared in the above embodiments, reference may be made to the embodiments described above in respect of the structure of the array substrate, and details are not repeated herein.

The embodiments of the present disclosure further provide a display panel. The display panel includes an array substrate and a color filter substrate disposed opposite to each other, and a liquid crystal layer disposed between the array substrate and the color filter substrate. The array substrate is the array substrate shown in FIG. 1, FIG. 3, FIG. 4, FIG. 5, FIG. 6, or FIG. 7.

The embodiments of the present disclosure further provide a display device. The display device may be any product or component having a display function such as a mobile phone, a tablet computer, a television, a display, a notebook computer, a digital photo frame, or a navigator. The display device includes the display panel in the above embodiments and a backlight source. The backlight source is disposed on the side of the array substrate facing away from the color filter substrate.

It should be noted that in the drawings, the dimensions of layers and regions may be exaggerated for clarity of illustration. Also, it is understood that when an element or layer is referred to as being "on" another element or layer, it may be directly on the other element or there may be an intervening layer. In addition, it is understood that when an element or layer is referred to as being "under" another element or layer, it may be directly under the other element or there may be more than one intervening layer or element. In addition, it is also understood that when a layer or element is referred to as being "between" two layers or elements, it may be the only layer between two layers or elements, or there may be more than one intervening layer or element. Similar reference numerals indicate similar elements throughout.

In the present disclosure, the terms "first" and "second" are used for descriptive purposes only and are not to be construed as indicating or implying relative importance. The term "a plurality of" refers to two or more, unless specifically defined otherwise.

The descriptions above are merely optional embodiments of the present disclosure, and are not intended to limit the present disclosure. Any modifications, equivalent substitutions, improvements, and the like made within the spirit and principles of the present disclosure shall be included within the protection scope of the present disclosure.

What is claimed is:

1. An array substrate, comprising a display region and a non-display region located at a periphery of the display region, the array substrate comprising:
    a substrate;
    a first transistor and a second transistor that are disposed on the substrate, wherein the first transistor is disposed in the display region, and the second transistor is disposed in the non-display region; the first transistor comprises a first gate and a first active layer, the first gate being disposed on a side of the first active layer facing away from the substrate; and the second transistor comprises a second active layer and a second gate; and
    a data line and a pixel electrode that are disposed in the display region, wherein the data line is disposed on a side of the first active layer close to the substrate and is lapped with the first active layer, and the pixel electrode is disposed on a side of the first gate facing away from the substrate and is lapped with the first active layer;
    wherein the data line and the second gate are disposed in a same layer and made of a same material.

2. The array substrate according to claim 1, wherein the first active layer comprises a first conductor portion and a second conductor portion opposite to each other, and a first channel region disposed between the first conductor portion and the second conductor portion, an orthographic projection of the first channel region on the substrate is within an orthographic projection of the first gate on the substrate; wherein
    an orthographic projection of the data line on the substrate has an overlapping region with an orthographic projection of the first conductor portion on the substrate, and the first conductor portion is lapped with the data line; and
    an orthographic projection of the pixel electrode on the substrate has an overlapping region with an orthographic projection of the second conductor portion on the substrate, and the pixel electrode is lapped with the second conductor portion.

3. The array substrate according to claim 2, further comprising: a transparent connecting electrode disposed between the pixel electrode and the first active layer, wherein an orthographic projection of the transparent connecting electrode on the substrate has an overlapping region with the orthographic projection of the pixel electrode on the substrate, and has an overlapping region with the orthographic projection of the second conductor portion on the substrate, and the pixel electrode is lapped with the second conductor portion by means of the transparent connecting electrode.

4. The array substrate according to claim 2, further comprising: a light shielding layer, wherein the light shielding layer and the data line are disposed in a same layer and made of a same material, and the orthographic projection of the first channel region on the substrate is within an orthographic projection of the light shielding layer on the substrate.

5. The array substrate according to claim 4, wherein a plurality of first transistors are provided, and the light shielding layer comprises a plurality of light shielding blocks in one-to-one correspondence with the plurality of first transistors, wherein
the orthographic projection of the first channel region of the first active layer in the first transistor on the substrate is within an orthographic projection of the corresponding light shielding block on the substrate.

6. The array substrate according to claim 1, wherein the first active layer and the second active layer are disposed in different layers, and the second active layer is closer to the substrate than the second gate is.

7. The array substrate according to claim 6, wherein the second transistor further comprises: a source and a drain which are lapped with the second active layer, wherein the source and the drain are disposed in a same layer and made of a same material, and the source and the drain are both disposed on a side of the second gate facing away from the substrate; wherein
the source, the drain and the first active layer are disposed in the same layer, and a material of the first active layer is different from a material of the source and the drain; or
the source, the drain and the first gate are disposed in the same layer and made of the same material.

8. The array substrate according to claim 7, wherein in a case that the source, the drain and the first active layer are disposed in the same layer, the array substrate further comprises: a first gate insulating layer disposed between the second gate and the second active layer, and an auxiliary insulating layer disposed between the first active layer and the data line;
the array substrate is provided with a first via hole penetrating through the auxiliary insulating layer, and a plurality of lap joint via holes penetrating through the auxiliary insulating layer and the first gate insulating layer, wherein the first active layer is lapped with the data line through the first via hole, the source is lapped with the second active layer through one of the lap joint via holes, and the drain is lapped with the second active layer through another one of the lap joint via holes;
wherein an opening of the first via hole facing away from the substrate and openings of the lap joint via holes facing away from the substrate are all on a surface of the auxiliary insulating layer facing away from the substrate.

9. The array substrate according to claim 8, further comprising: a second gate insulating layer and an interlayer dielectric layer; wherein
the second active layer is disposed on a side of the first gate insulating layer close to the substrate; the data line and the second gate are both disposed between the first gate insulating layer and the auxiliary insulating layer; the first active layer, the source and the drain are all disposed between the auxiliary insulating layer and the second gate insulating layer; and the first gate is disposed between the second gate insulating layer and the interlayer dielectric layer.

10. The array substrate according to claim 1, wherein the first active layer and the second active layer are disposed in a same layer but made of different materials, and the second gate is closer to the substrate than the second active layer is.

11. The array substrate according to claim 10, wherein the second transistor further comprises: a source and a drain which are lapped with the second active layer, wherein the source and the drain are disposed in a same layer and made of a same material, and the source and the drain are both disposed on a side of the second active layer facing away from the substrate;
wherein the array substrate further comprises: a connecting electrode, wherein the connecting electrode is lapped with the first active layer and the data line, and the connecting electrode, the first gate, the source and the drain are disposed in a same layer and made of a same material.

12. The array substrate according to claim 11, further comprising: a first gate insulating layer disposed between the second gate and the second active layer, and a second gate insulating layer disposed between the first active layer and the first gate;
wherein the array substrate is provided with a first sub-via hole penetrating through the second gate insulating layer and the first gate insulating layer, and a second sub-via hole and a plurality of lap joint via holes penetrating through the second gate insulating layer, wherein the connecting electrode is lapped with the first active layer through the second sub-via hole, and is lapped with the data line through the first sub-via hole, the source is lapped with the second active layer through one of the lap joint via holes, and the drain is lapped with the second active layer through another one of the lap joint via holes;
wherein an opening of the first sub-via hole facing away from the substrate, an opening of the second sub-via hole facing away from the substrate, and openings of the lap joint via holes facing away from the substrate are all on a surface of the second gate insulating layer facing away from the substrate.

13. The array substrate according to claim 12, further comprising: an interlayer dielectric layer; wherein
the second gate and the data line are disposed on a side of the first gate insulating layer close to the substrate; the first active layer and the second active layer are disposed between the first gate insulating layer and the second gate insulating layer; and the source, the drain, the connecting electrode and the first gate are all disposed between the second gate insulating layer and the interlayer dielectric layer.

14. The array substrate according to claim 9, further comprising: a transparent connecting electrode disposed on a side of the interlayer dielectric layer facing away from the substrate, and a planarization layer disposed on a side of the transparent connecting electrode facing away from the substrate, the pixel electrode being disposed on a side of the planarization layer facing away from the substrate;
wherein the array substrate is provided with a connecting via hole penetrating through the planarization layer, and a second via hole penetrating through the interlayer dielectric layer and the second gate insulating layer, the pixel electrode is lapped with the transparent connecting electrode through the connecting via hole, and the transparent connecting electrode is lapped with the first active layer through the second via hole.

15. The array substrate according to claim 14, further comprising: a passivation layer disposed on a side of the pixel electrode facing away from the substrate, and a common electrode layer disposed on a side of the passivation layer facing away from the substrate.

16. The array substrate according to claim 15, wherein the common electrode layer comprises: a light shielding portion and a transparent conductive portion disposed on a side of the light shielding portion facing away from the substrate, wherein an orthographic projection of the light shielding portion on the substrate is not overlapped with an orthographic projection of the pixel electrode on the substrate.

17. The array substrate according to claim 14, further comprising: a support part, wherein a portion of the support part is in the connecting via hole, and the other portion is outside the connecting via hole.

18. The array substrate according to claim 15, wherein the first transistor is an oxide thin film transistor, and the second transistor is a low temperature poly-silicon thin film transistor.

19. The array substrate according to claim 18, further comprising: a gate drive circuit disposed in the non-display region, wherein the gate drive circuit comprises a plurality of second transistors.

20. A display panel, comprising: an array substrate and a color filter substrate disposed opposite to each other, and a liquid crystal layer disposed between the array substrate and the color filter substrate, wherein the array substrate comprises a display region and a non-display region located at a periphery of the display region, the array substrate comprising:
- a substrate;
- a first transistor and a second transistor that are disposed on the substrate, wherein the first transistor is disposed in the display region, and the second transistor is disposed in the non-display region: the first transistor comprises a first gate and a first active layer, the first gate being disposed on a side of the first active layer facing away from the substrate; and the second transistor comprises a second active layer and a second gate; and
- a data line and a pixel electrode that are disposed in the display region, wherein the data line is disposed on a side of the first active layer close to the substrate and is lapped with the first active layer, and the pixel electrode is disposed on a side of the first gate facing away from the substrate and is lapped with the first active layer;
- wherein the data line and the second gate are disposed in a same layer and made of a same material.

* * * * *